United States Patent [19]

Matsuzawa et al.

[11] Patent Number: 5,151,700
[45] Date of Patent: Sep. 29, 1992

[54] SERIAL-PARALLEL TYPE A/D CONVERTER

[75] Inventors: Akira Matsuzawa; Masaaki Kanoh; Shoichiro Tada, all of Osaka, Japan

[73] Assignee: Matsushita Electric Industrial Co., Ltd., Osaka, Japan

[21] Appl. No.: 559,088

[22] Filed: Jul. 30, 1990

[30] Foreign Application Priority Data

Aug. 4, 1989 [JP] Japan .................. 1-203328

[51] Int. Cl.⁵ .............................. H03M 1/14
[52] U.S. Cl. .................... 341/156; 341/155
[58] Field of Search ............... 341/156, 159, 158, 160, 341/161, 100, 139, 131, 122, 155

[56] References Cited

U.S. PATENT DOCUMENTS

| | | | |
|---|---|---|---|
| 3,818,246 | 6/1974 | Hellwarth et al. | 307/577 |
| 4,495,472 | 1/1985 | Dwarakanath | 330/277 |
| 4,633,219 | 12/1986 | Zojer et al. | 340/347 AD |
| 4,635,036 | 1/1987 | Yoshizawa | 340/347 AD |
| 4,745,393 | 5/1988 | Tsukada et al. | 341/156 |
| 4,764,753 | 8/1988 | Yukawa | 340/347 AD |
| 4,771,266 | 9/1988 | Nunokawa | 341/161 R |
| 4,851,845 | 7/1989 | Hotta et al. | 341/159 |

FOREIGN PATENT DOCUMENTS 3405438 8/1985 Fed. Rep. of Germany .

OTHER PUBLICATIONS

Patent abstracts of Japan, unexamined applications, E. Field, vol. 13, No. 88 (E-721), Feb. 28, 1989 The Patent Office Japanese Government p. 120 E 721.
Soviet Patents abstracts, E1 section, week 8909, 1989 Derwent Publications Ltd., London, U 21, p. 8.
Soviet Inventions Illustrated, E1 section, week 8814, May 18, 1988 Derwent Publication Ltd., London, U 21, pp. 21-22.
Soviet Inventions Illustrated, E1 section, week 8707, Apr. 1, 1987 Derwent publications Ltd., London, U 21, p. 5.
Soviet Patent abstracts, E1 section, week 8947, Derwent Publications Ltd., London, U 21, p. 10.

Primary Examiner—A. D. Pellinen
Assistant Examiner—B. K. Young
Attorney, Agent, or Firm—Pollock, VandeSande & Priddy

[57] ABSTRACT

A plurality of different reference voltages are generated. A set of differential conversion circuits has first input terminals subjected in common to an analog input signal and second input terminals subjected to the respective reference voltages, and converts differences between voltages at the first and second input terminals into differential output voltages. A first A/D conversion circuit compares the analog input signal with the reference voltages to perform a higher-order A/D conversion of the input analog signal. At least two of the differential output voltages are selected. An interval between the selected differential output voltages is divided, and divided voltages are generated in accordance with the division. A second A/D conversion circuit compares the divided voltages to perform a lower-order A/D conversion of the analog input signal.

9 Claims, 28 Drawing Sheets

SERIAL-PARALLEL TYPE A/D CONVERTER

BACKGROUND OF THE INVENTION

1. Field of the Invention

This invention relates to a serial-parallel type analog-to-digital (A/D) converter.

2. Description of the Prior Art

A typical prior art serial-parallel type A/D converter includes higher-order and lower-order A/D converting sections, a digital-to-analog (D/A) converting section, and a subtracter. The higher-order A/D converting section roughly converts an analog input signal into a corresponding digital signal which constitutes a higher-order part of a final digital signal. The digital output signal from the higher-order A/D converting section is converted back into a corresponding analog signal by the D/A converting section. The subtracter executes the subtraction between the input analog signal and the analog output signal from the D/A converting section, and amplifies the resultant difference between the two analog signals. The lower-order A/D converting section converts the analog output signal from the subtracter into a corresponding digital signal which constitutes a lower-order part of the final digital signal. The digital output signals from the higher-order and lower-order A/D converting sections are combined to form the final digital signal.

In the above-mentioned prior-art serial-parallel type A/D converter, it is necessary to accurately set various parameters such as the gain of the subtracter, the full-scale voltage of the lower-order A/D converting section, and the offset voltage of the D/A converting section. In order to realize the accurate setting of these parameters, many adjustment points are provided. The large number of the adjustment points tends to decrease the stability in the conversion accuracy. In addition, it is generally difficult to form the prior art A/D converter by a monolithic IC (integrated circuit).

SUMMARY OF THE INVENTION

It is an object of this invention to provide an accurate serial-parallel type A/D converter.

It is another object of this invention to provide a serial-parallel type A/D converter which can be formed by a monolithic IC.

According to a first aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into differential output voltages; a first A/D conversion circuit comparing the analog input signal with the reference voltages to perform a higher-order A/D conversion of the input analog signal; means for selecting at least two of the differential output voltages; means for dividing an interval between the differential output voltages selected by the selecting means, and for generating divided voltages in accordance with said dividing; and a second A/D conversion circuit comparing the divided voltages to perform a lower-order A/D conversion of the analog input signal.

According to a second aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into differential output voltages; a set of sample circuits sampling the differential output voltages and outputting sampled differential output voltages; a first A/D conversion circuit comparing the analog input signal with the reference voltages to perform a higher-order A/D conversion of the input analog signal; means for selecting at least two of the sampled differential output voltages; means for dividing an interval between the sampled differential output voltages selected by the selecting means, and for generating divided voltages in accordance with said dividing; and a second A/D conversion circuit comparing the divided voltages to perform a lower-order A/D conversion of the analog input signal.

According to a third aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into differential output voltages; a set of first sample circuits sampling the differential output voltages and outputting first sampled differential output voltages; a first A/D conversion circuit comparing the analog input signal with the reference voltages to perform a higher-order A/D conversion of the input analog signal; means for selecting at least two of the first sampled differential output voltages; a set of second sample circuits sampling the first sampled differential output voltages selected by the selecting means, and outputting second sampled differential output voltages; means for dividing an interval between the second sampled differential output voltages, and for generating divided voltages in accordance with said dividing; and a second A/D conversion circuit comparing the divided voltages to perform a lower-order A/D conversion of the analog input signal.

According to a fourth aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into differential output voltages; a first A/D conversion circuit comparing the analog input signal with a reference voltage intermediate between the reference voltages of adjacent differential conversion circuits to perform a higher-order A/D conversion of the input analog signal; means for selecting at least two of the differential output voltages; means for dividing an interval between the differential output voltages selected by the selecting means, and for generating divided voltages in accordance with said dividing; and a second A/D conversion circuit comparing the divided voltages to perform a lower-order A/D conversion of the analog input signal; wherein a comparison voltage range of the second A/D conversion circuit contains a comparison voltage range of a unit comparison segment of the first A/D conversion circuit.

According to a fifth aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into differential output voltages; a first A/D conversion circuit comparing the analog input signal with a reference voltage intermediate between the reference voltages of adjacent differential conversion circuits to perform a higher-order A/D conversion of the input analog signal; means for selecting at least two of the differential output voltages, wherein one differential output voltage extends between the selected differential output voltages; means for dividing an interval between the differential output voltages selected by the selecting means, and for generating divided voltages in accordance with said dividing; and a second A/D conversion circuit comparing the divided voltages to perform a lower-order A/D conversion of the analog input signal; wherein a comparison voltage range of the second A/D conversion circuit contains a comparison voltage range of a unit comparison segment of the first A/D conversion circuit.

According to a sixth aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into differential output voltages; a first A/D conversion circuit comparing the analog input signal with a reference voltage intermediate between the reference voltages of adjacent differential conversion circuits to perform a higher-order A/D conversion of the input analog signal; means for selecting adjacent three of the differential output voltages; means for dividing intervals between the differential output voltages selected by the selecting means, and for generating divided voltages in accordance with said dividing; and a second A/D conversion circuit comparing the divided voltages to perform a lower-order A/D conversion of the analog input signal; wherein a comparison voltage range of the second A/D conversion circuit contains a comparison voltage range of a unit comparison segment of the first A/D conversion circuit.

According to a seventh aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into output currents; a first A/D conversion circuit comparing the analog input signal with the reference voltages to perform a higher-order A/D conversion of the input analog signal; first selecting means for selecting at least two of the output currents; means for converting the output currents selected by the first selecting means into corresponding output voltages; second selecting means for selecting at least two of the output voltages; means for dividing an interval between the output voltages, and for generating divided voltages in accordance with said dividing; and a second A/D conversion circuit comparing the divided voltages and the output voltages selected by the second selecting means to perform a lower-order A/D conversion of the analog input signal.

According to an eighth aspect of this invention, a serial-parallel type A/D converter comprises means for generating a plurality of different reference voltages; a set of differential conversion circuits having first input terminals subjected in common to an analog input signal and second input terminals subjected to the respective reference voltages, and converting differences between voltages at the first and second input terminals into output voltages; a first A/D conversion circuit comparing the analog input signal with the reference voltages to perform a higher-order A/D conversion of the input analog signal; first selecting means for selecting at least two of the output voltages; second selecting means for selecting at least two of the output voltages selected by the first selecting means; means for dividing an interval between the output voltages selected by the first selecting means, and for generating divided voltages in accordance with said dividing; and a second A/D conversion circuit comparing the divided voltages and the output voltages selected by the second selecting means to perform a lower-order A/D conversion of the analog input signal.

According to a ninth aspect of this invention, a serial-parallel type A/D converter comprises means for generating a plurality of different reference voltages; a set of differential circuits deriving differences between a voltage of an analog input signal and the respective reference voltages, and converting said differences into corresponding difference signals; first A/D converting means for converting the input analog signal into a higher-order part of a digital signal; means for selecting at least two of the difference signals in response to a result of said converting by the first A/D converting means; and second A/D converting means for deriving a lower-order part of the digital signal from the difference signals selected by the selecting means.

According to a tenth aspect of this invention, a serial-parallel type A/D converter comprises means for generating a plurality of different reference voltages; a set of differential circuits deriving differences between a voltage of an analog input signal and the respective reference voltages, and converting said differences into corresponding difference signals; means for performing a higher-order A/D conversion of the input analog signal; means for selecting at least two of the difference signals in response to a result of said higher-order A/D conversion; means for dividing an interval between the difference signals selected by the selecting means, and for generating divided signals in accordance with said dividing; and means for comparing the divided signals to perform a lower-order A/D conversion of the analog input signal.

DESCRIPTION OF THE FIRST PREFERRED EMBODIMENT

Figure 1:
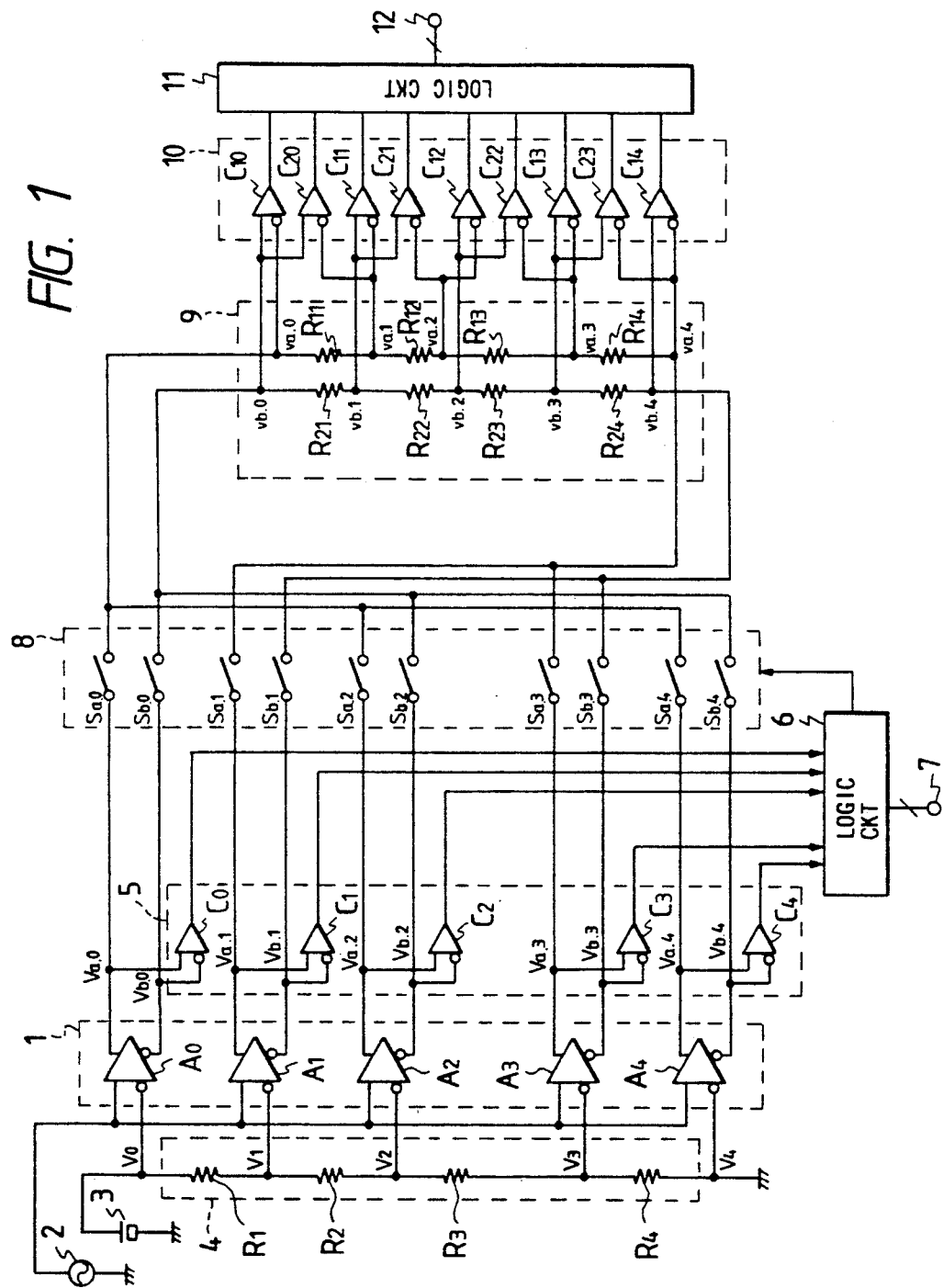
FIG. 1 is a diagram of a serial-parallel type A/D converter according to a first embodiment of this invention.

With reference to FIG. 1, a serial-parallel type A/D converter includes a set 1 of differential conversion circuits A0-A4 generally composed of differential amplifiers. First input terminals of the differential conversion circuits A0-A4 are subjected to an analog input signal 2. Second input terminals of the differential conversion circuits A0-A4 are subjected to predetermined reference voltages V0-V4 respectively. The reference voltages V0-V4 are separated by equal intervals. A reference voltage source 3 applies the reference voltage V0 to the differential conversion circuit A0. A voltage divider 4 including a series combination of equal resistors R1-R4 is connected to the reference voltage source 3, and divides the reference voltage V0 and thereby generates the reference voltages V1-V3 applied to the respective differential conversion circuits A1-A3. The reference voltage V4 applied to the differential conversion circuit A4 equals a ground potential which agrees with the potential at the negative terminal of the reference voltage source 3. The differential conversion circuits A0-A4 generate non-inverted output voltages Va,0-Va,4 and also inverted output voltages Vb,0-Vb,4 which depend on the subtractions between the voltage of the analog input signal 2 and the reference voltages V0-V4 respectively.

A set 5 of higher-order comparators C0-C4 is connected to the differential conversion circuit set 1. Specifically, first input terminals of the higher-order comparators C0-C4 are connected to non-inverted output terminals of the differential conversion circuits A0-A4 respectively, while second input terminals of the higher-order comparators C0-C4 are connected to inverted output terminals of the differential conversion circuits A0-A4 respectively. The higher-order comparators C0-C4 compare the non-inverted output voltages Va,0-Va,4 from the differential conversion circuits A0-A4 with the inverted output voltages Vb,0-Vb,4 from the differential conversion circuits A0-A4, and generate binary signals which represent the results of the related comparisons respectively.

A higher-order logical circuit 6 is connected to the higher-order comparators C0-C4. The higher-order logical circuit 6 receives the binary signals from the higher-order comparators C0-C4 and converts them into a corresponding parallel-form digital signal 7 which forms a higher-order part of a final digital signal. In addition, the higher-order logical circuit 6 generates a multi-bit selection signal in response to the binary signals from the higher-order comparators C0-C4.

A set 8 of switches Sa,0-Sa,4 and Sb,0-Sb,4 is connected between the differential conversion circuit set 1 and a voltage divider 9. Specifically, each of the switches Sa,0–Sa,4 and Sb,0–Sb,4 has a switching part, and two terminals which can be connected to and disconnected from each other by the switching part. First terminals of the switches Sa,0–Sa,4 are connected to the non-inverted output terminals of the differential conversion circuits A0–A4 respectively. Second terminals of the switches Sa,0, Sa,2, and Sa,4 are connected to a first end of a first segment of the voltage divider 9 which includes a series combination of equal resistors R11–R14. Second terminals of the switches Sa,1 and Sa,3 are connected to a second end of the first segment of the voltage divider 9. First terminals of the switches Sb,0–Sb,4 are connected to the inverted output terminals of the differential conversion circuits A0–A4 respectively. Second terminals of the switches Sb,0, Sb,2, and Sb,4 are connected to a first end of a second segment of the voltage divider 9 which includes a series combination of equal resistors R21–R24. Second terminals of the switches Sb,1 and Sb,3 are connected to a second end of the second segment of the voltage divider 9.

The switch set 8 is connected to the higher-order logical circuit 6 to receive the selection signal from the higher-order logical circuit 6. The switches Sa,0–Sa,4 and Sb,0–Sb,4 are controlled by the selection signal fed from the higher-order logical circuit 6. One of the switches Sa,0, Sa,2, and Sa,4 and one of the switches Sa,1 and Sa,3 are closed by the selection signal so that one of the non-inverted output voltages Va,0, Va,2, and Va,4 and one of the non-inverted output voltages Va,1 and Va,3 from the differential conversion circuits A0–A4 are selected and transmitted to the opposite ends of the first segment of the voltage divider 9. Similarly, one of the switches Sb,0, Sb,2, and Sb,4 and one of the switches Sb,1 and Sb,3 are closed by the selection signal so that one of the inverted output voltages Vb,0, Vb,2, and Vb,4 and one of the inverted output voltages Vb,1 and Vb,3 from the differential conversion circuits A0–A4 are selected and transmitted to the opposite ends of the second segment of the voltage divider 9.

The voltages at the first and second ends of the first segment of the voltage divider 9 are denoted by the characters va,0 and va,4 respectively. The first segment of the voltage divider 9 divides the resultant potential thereacross and thus generates voltages va,1–va,3 which appear at respective nodes between the resistors R11–R14 and which reside between the voltages va,0 and va,4. The voltages va,0–va,4 are separated by equal intervals. The voltages at the first and second ends of the second segment of the voltage divider 9 are denoted by the characters vb,0 and vb,4 respectively. The second segment of the voltage divider 9 divides the resultant potential thereacross and thus generates voltages vb,1–vb,3 which appear at respective nodes between the resistors R21–R24 and which reside between the voltages vb,0 and vb,4. The voltages vb,0–vb,4 are separated by equal intervals.

A set 10 of lower-order comparators C10–C14 and C20–C23 is connected to the voltage divider 9. The voltages vb,0–vb,4 are applied to first input terminals of the lower-order comparators C10–C14 respectively. The voltages va,0–va,4 are applied to second input terminals of the lower-order comparators C10–C14 respectively. In addition, the voltages vb,0–vb,3 are applied to first input terminals of the lower-order comparators C20–C23 respectively. The voltages va,1–va,4 are applied to second input terminals of the lower-order comparators C20–C23 respectively. Each of the lower-order comparators C10–C14 and C20–C23 compares the two voltages applied to its first and second input terminals, and generates a binary signal representing the result of the related comparison.

A lower-order logical circuit 11 is connected to the lower-order comparator set 10. The lower-order logical circuit 11 receives the binary signals from the lower-order comparators C10–C14 and C20–C23 and converts them into a corresponding parallel-form digital signal 12 which forms a lower-order part of a final digital signal. The lower-order logical circuit 11 has an encoder which can be of a conventional design.

Figure 2A:
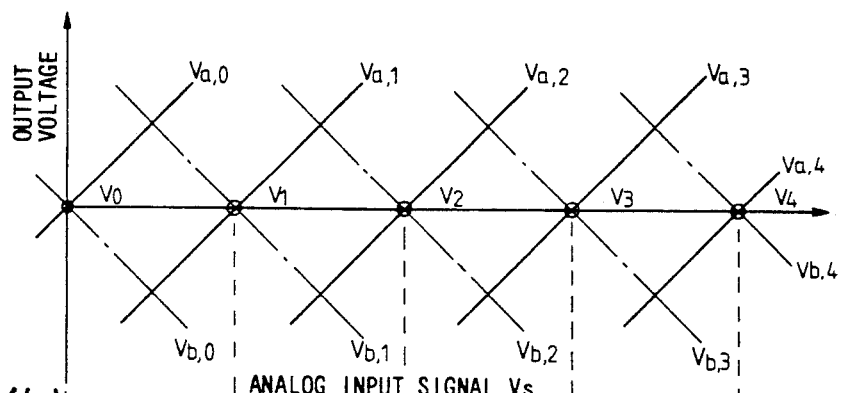
FIGS. 2a-2c are diagrams showing the relation between an analog input signal and the output voltages from the differential conversion circuits, the relation between the analog input signal and the output signals from the higher-order comparators, and the relation between the analog input signal and the states of the switches in the A/D converter of FIG. 1.
Figure 2B:
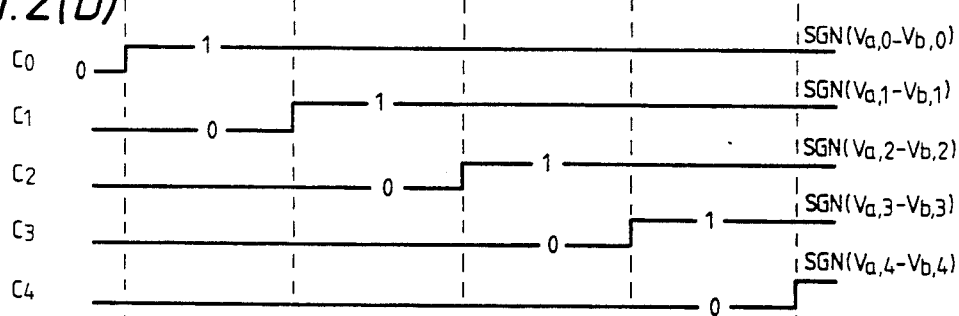
Figure 2C:
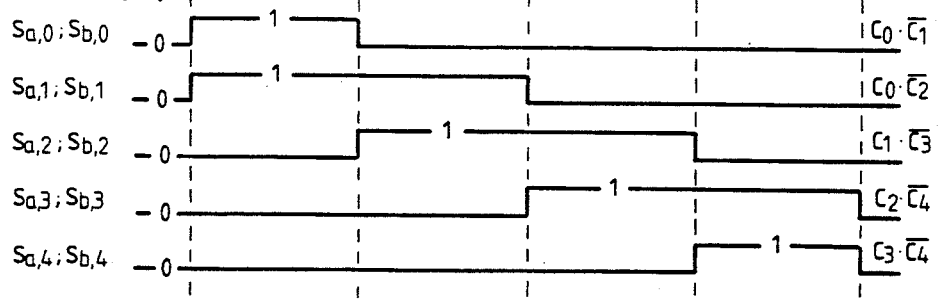

FIGS. 2a–2c show the relation between the analog input signal 2 and the output signals from the differential conversion circuits A0–A4, the relation between the analog input signal and the output signals from the higher-order comparators C0–C4, and the relation between the analog input signal and the states of the switches Sa,0–Sa,4 and Sb,0–Sb,4. In FIGS. 2a–2c, the output signals from the comparators C0–C4 are also denoted by the characters C0–C4 for an easy understanding.

As shown in the FIG. 2a, the non-inverted output voltages Va,0–Va,4 and the inverted output voltages Vb,0–Vb,4 vary linearly with the differences between the voltage Vs of the analog input signal 2 and the respective reference voltages V0–V4 at opposite slopes.

The differential conversion circuit set 1 and the higher-order comparator set 5 cooperate to serve as comparators for comparing the voltage Vs of the analog input signal 2 with the respective reference voltages V0–V4. As shown in the FIG. 2b, when the voltage Vs of the analog input signal 2 is higher than the greatest reference voltage V0, all the binary output signals from the higher-order comparators C0–C4 are "0". When the voltage Vs of the analog input signal 2 resides between the greatest reference voltage V0 and the second greatest reference voltage V1, only the binary output signal from the higher-order comparator C0 is "1" while the others are "0". When the voltage Vs of the analog input signal 2 resides between the reference voltage V1 and the subsequent reference voltage V2, the binary output signals from the higher-order comparators C0 and C1 are "1" while the others are "0". When the voltage Vs of the analog input signal 2 resides between the reference voltage V2 and the subsequent reference voltage V3, the binary output signals from the higher-order comparators C0–C2 are "1" while the others are "0". When the voltage Vs of the analog input signal 2 resides between the reference voltage V3 and the smallest reference voltage V4, only the binary output signal from the higher-order comparator C4 is "0" while the others are "1". When the voltage Vs of the analog input signal 2 is lower than the smallest reference voltage V4, all the binary output signals from the higher-order comparators C0–C4 are "1".

The selection signal fed from the higher-order logical circuit 6 to the switch set 8 has five bits. The switches Sa,0 and Sb,0 are controlled by a first bit of the selection signal. The higher-order logical circuit 6 generates the first bit of the selection signal in agreement with an AND operation between the binary output signal from the higher-order comparator C0 and an inversion of the binary output signal from the higher-order comparator C1. Thus, the switches Sa,0 and Sb,0 are controlled in response to the AND operation between the binary output signal from the higher-order comparator C0 and the inversion of the binary output signal from the higher-order comparator C1. The switches $Sa,1$ and $Sb,1$ are controlled by a second bit of the selection signal. The higher-order logical circuit 6 generates the second bit of the selection signal in agreement with an AND operation between the binary output signal from the higher-order comparator C0 and an inversion of the binary output signal from the higher-order comparator C2. Thus, the switches $Sa,1$ and $Sb,1$ are controlled in response to the AND operation between the binary output signal from the higher-order comparator C0 and the inversion of the binary output signal from the higher-order comparator C2. The switches $Sa,2$ and $Sb,2$ are controlled by a third bit of the selection signal. The higher-order logical circuit 6 generates the third bit of the selection signal in agreement with an AND operation between the binary output signal from the higher-order comparator C1 and an inversion of the binary output signal from the higher-order comparator C3. Thus, the switches $Sa,2$ and $Sb,2$ are controlled in response to the AND operation between the binary output signal from the higher-order comparator C1 and the inversion of the binary output signal from the higher-order comparator C3. The switches $Sa,3$ and $Sb,3$ are controlled by a fourth bit of the selection signal. The higher-order logical circuit 6 generates the fourth bit of the selection signal in agreement with an AND operation between the binary output signal from the higher-order comparator C2 and an inversion of the binary output signal from the higher-order comparator C4. Thus, the switches $Sa,3$ and $Sb,3$ are controlled in response to the AND operation between the binary output signal from the higher-order comparator C2 and the inversion of the binary output signal from the higher-order comparator C4. The switches $Sa,4$ and $Sb,4$ are controlled by a fifth bit of the selection signal. The higher-order logical circuit 6 generates the fifth bit of the selection signal in agreement with an AND operation between the binary output signal from the higher-order comparator C3 and an inversion of the binary output signal from the higher-order comparator C4. Thus, the switches $Sa,4$ and $Sb,4$ are controlled in response to the AND operation between the binary output signal from the higher-order comparator C3 and the inversion of the binary output signal from the higher-order comparator C4.

In the FIG. 2c, "1" means that the related switches are in closed states (ON states), while "0" means that the related switches are in open states (OFF states). As shown in the FIG. 2c, when the voltage Vs of the analog input signal 2 resides between the voltages V0 and V1, the switches $Sa,0$, $Sa,1$, $Sb,0$, and $Sb,0$ are closed while the others are open. When the voltage Vs of the analog input signal 2 resides between the voltages V1 and V2, the switches $Sa,1$, $Sa,2$, $Sb,1$, and $Sb,2$ are closed while the others are open. When the voltage Vs of the analog input signal 2 resides between the voltages V2 and V3, the switches $Sa,2$, $Sa,3$, $Sb,2$, and $Sb,3$ are closed while the others are open. When the voltage Vs of the analog input signal 2 resides between the voltages V3 and V4, the switches $Sa,3$, $Sa,4$, $Sb,3$, and $Sb,4$ are closed while the others are open. Accordingly, a pair of adjacent ones of the differential conversion circuits A0-A4 are according to the voltage Vs of the analog input signal 2, and the output signals from the pair of the selected adjacent differential conversion circuits are transmitted via the switch set 8 to the voltage divider 9. Specifically, the selection of the differential conversion circuits is designed so as to satisfy the following conditions. A first member of a pair of selected differential conversion circuits is subjected to the lowest of the reference voltages which are higher than the voltage Vs of the analog input signal 2, and a second member of the pair is subjected to the highest of the reference voltages which are lower than the voltage Vs of the analog input signal 2.

Figure 3:
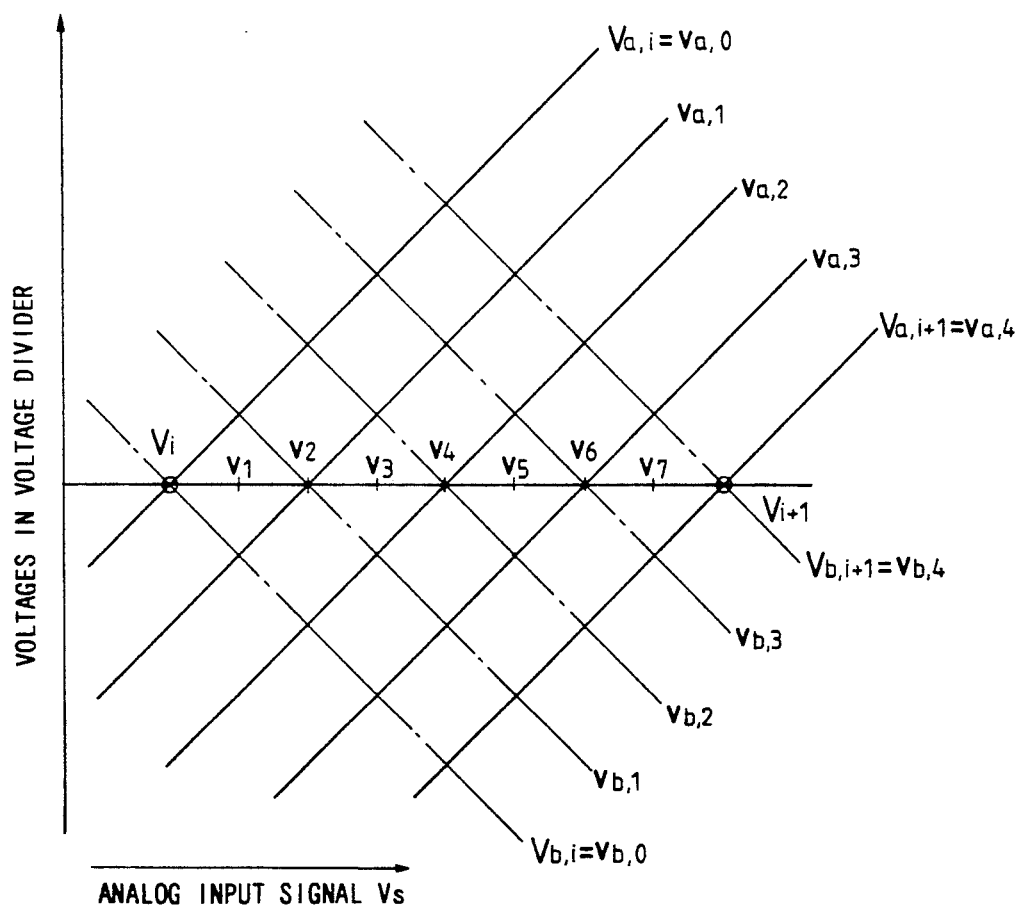
FIG. 3 is a diagram showing the relation between the analog input signal and voltages at respective nodes in the voltage divider of FIG. 1.

FIG. 3 shows the relation between the voltage Vs of the analog input signal 2 and the voltages $va,0$–$va,4$ and $vb,0$–$vb,4$ generated in the voltage divider 9. In FIG. 3, Vi and Vi+1 denote the reference voltages applied to a pair of adjacent higher-order comparators whose outputs are selected and fed to the voltage divider 9 by the switch set 8. As shown in FIG. 3, the difference between the reference voltages Vi and Vi+1 are divided into four equal intervals separated at points v2, v4, and v6. The lower-order comparators C10–C14 provide detection of the analog input signal 2 with a resolution determined by the size of these divided intervals. In addition, the difference between the reference voltages Vi and Vi+1 are divided into intervals separated at points v1, v3, v5, and v7. The lower-order comparators C20–C23 provide detection of the analog input signal 2 with a resolution determined by the size of these divided intervals. The intervals separated at the points v2, v4, and v6 are offset with the intervals separated at the points v1, v3, v5, and v7, so that the difference between the reference voltages Vi and Vi+1 are divided into eight equal intervals separated at the points v1–v7. The lower-order comparators C10–C14 and the lower-order comparators C20–C23 cooperate to provide A/D conversion with a resolution determined by the size of these eight intervals.

Figure 4:
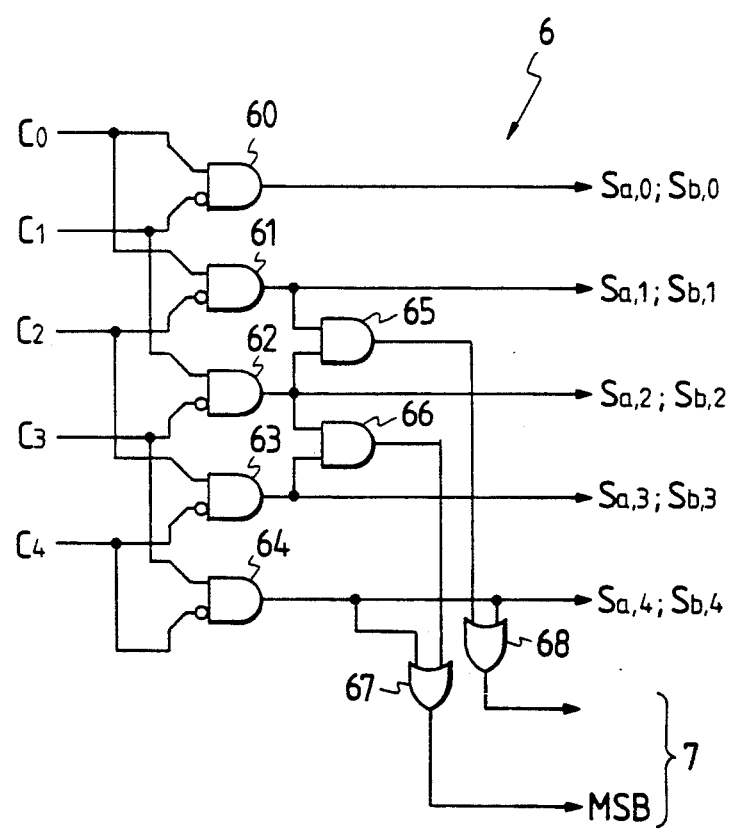
FIG. 4 is a block diagram of the higher-order logical circuit of FIG. 1.

As shown in FIG. 4, the higher-order logical circuit 6 includes a set of AND gates 60–64. First and second input terminals of the AND gate 60 are subjected to the output signals from the higher-order comparators C0 and C1 respectively. First and second input terminals of the AND gate 61 are subjected to the output signals from the higher-order comparators C0 and C2 respectively. First and second input terminals of the AND gate 62 are subjected to the output signals from the higher-order comparators C1 and C3 respectively. First and second input terminals of the AND gate 63 are subjected to the output signals from the higher-order comparators C2 and C4 respectively. First and second input terminals of the AND gate 64 are subjected to the output signals from the higher-order comparators C3 and C4 respectively. Each of the AND gates 60–64 is of the type having an inverter at its second input terminal. The output signal from the AND gate 60 is fed to the switches $Sa,0$ and $Sb,0$ as a selection signal. The output signal from the AND gate 61 is fed to the switches $Sa,1$ and $Sb,1$ as a selection signal. The output signal from the AND gate 62 is fed to the switches $Sa,2$ and $Sb,2$ as a selection signal. The output signal from the AND gate 63 is fed to the switches $Sa,3$ and $Sb,3$ as a selection signal. The output signal from the AND gate 64 is fed to the switches $Sa,4$ and $Sb,4$ as a selection signal. The output signals from the AND gates 61 and 62 are applied to first and second input terminals of an AND gate 65. The output signals from the AND gates 62 and 63 are applied to first and second input terminals of an AND gate 66. The output signals from the AND gates 64 and 66 are applied to first and second input terminals of an OR gate 67 respectively. The output signals from the AND gates 64 and 65 are applied to first and second input terminals of an OR gate 68 respectively. The output signals from the OR gates 67 and 68 constitute the digital output signal 7 from the logical circuit 6. Specifically, the output signal from the OR gate 67 forms the MSB of the final digital signal. The output signal from the OR gate 68 forms the subsequent bit of the final digital signal.

This embodiment dispenses with adjustment points so that this embodiment can be easily formed by a monolithic IC. Although relative gain accuracies of the differential conversion circuits A0–A4 are necessary, absolute gain accuracies thereof are unnecessary. Thus, the differential conversion circuits A0–A4 can be of a simple structure. The differential conversion circuits A0–A4 have the additional function of removing common-mode noise such as power supply noise.

DESCRIPTION OF THE SECOND PREFERRED EMBODIMENT

Figure 5:
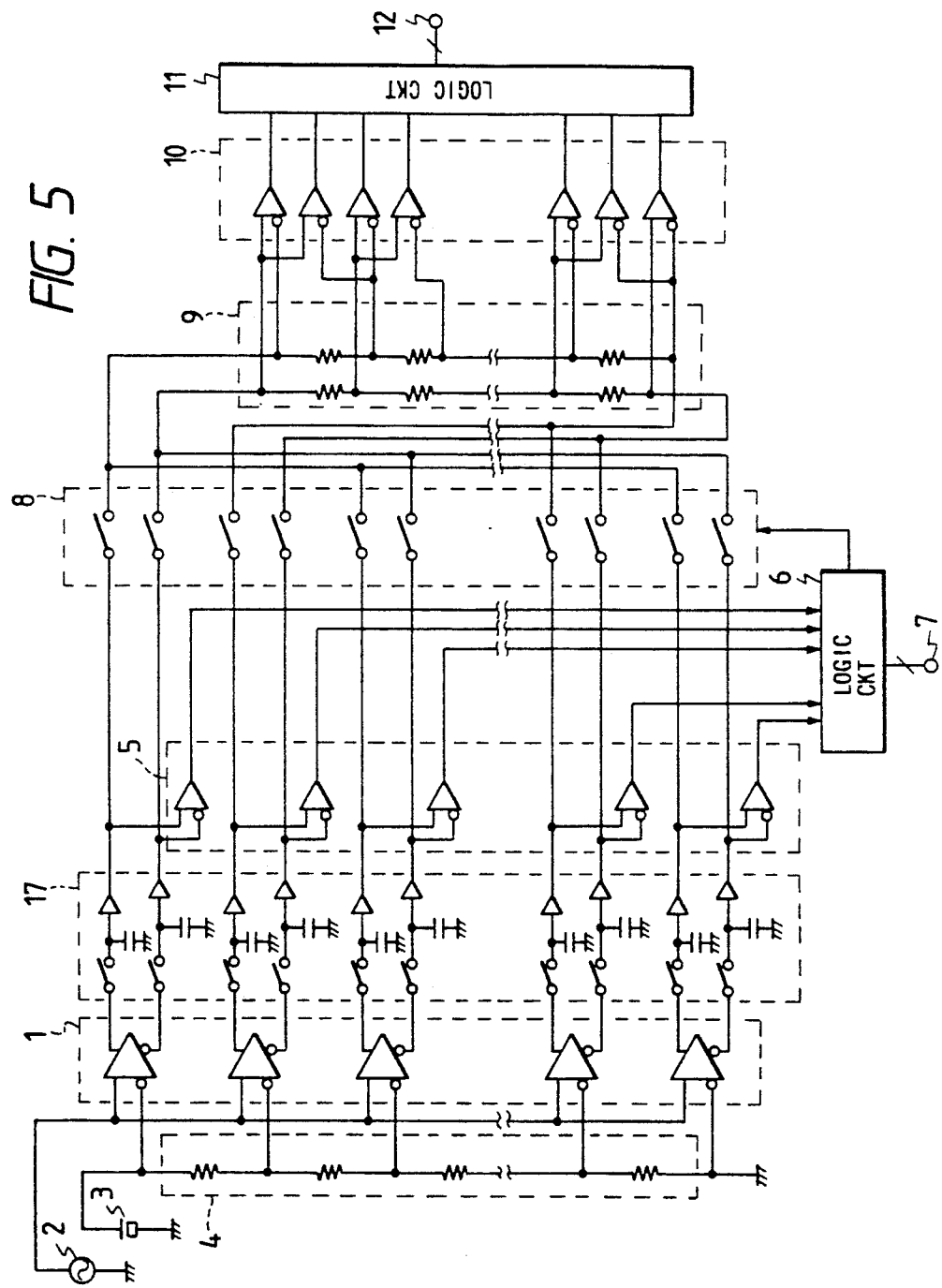
FIG. 5 is a diagram of a serial-parallel type A/D converter according to a second embodiment of this invention.

FIG. 5 shows a second embodiment of this invention which is similar to the embodiment of FIGS. 1–4 except that a set 17 of sample circuits is added between a differential conversion circuit set 1 and a switch set 8, and between the differential conversion circuit set 1 and a higher-order comparator set 5. The sample circuit set 17 samples and holds the non-inverted and inverted output signals from the differential conversion circuit set 1 in response to a sample pulse signal generated by a suitable circuit (not shown). The sample circuits can be composed of a simple structure including circuits such as MOS analog switches and source follower circuits.

Figure 6:
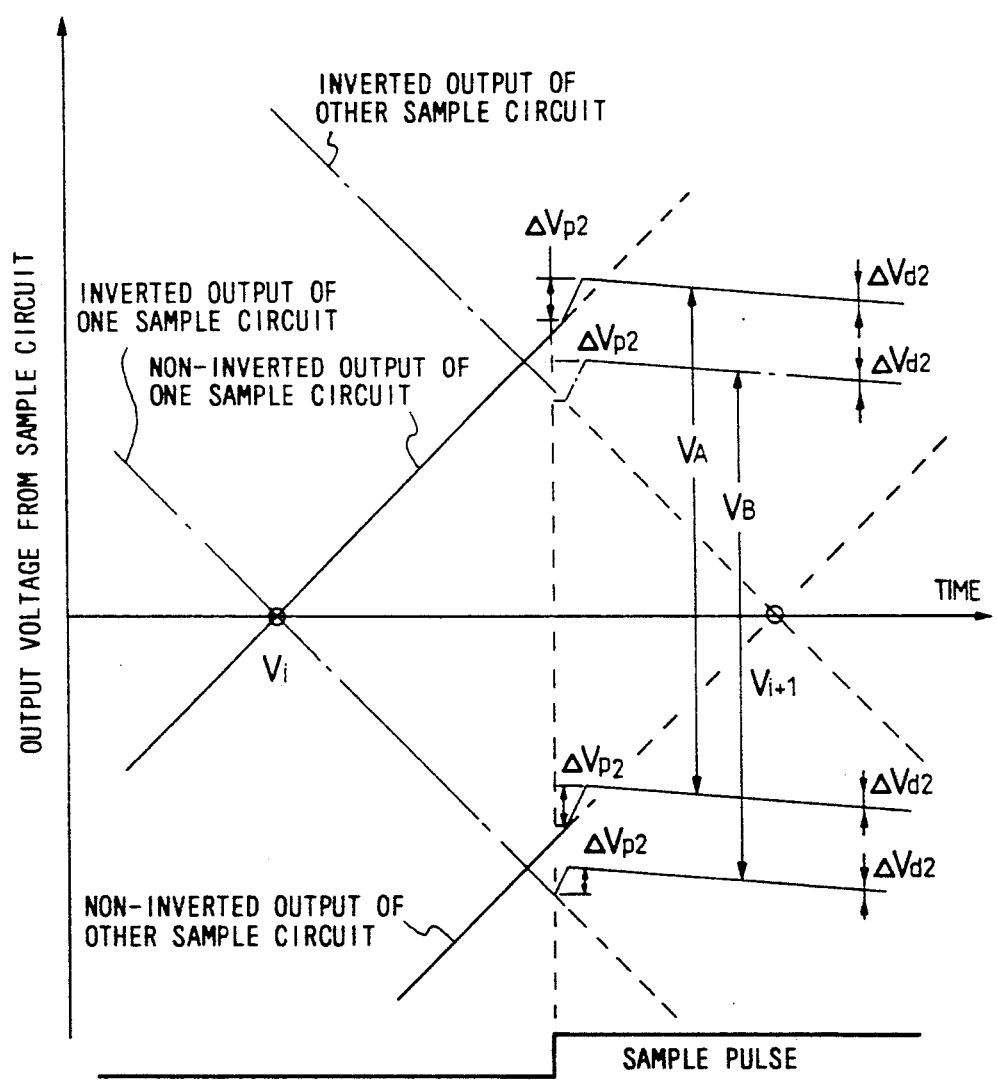
FIG. 6 is a diagram showing the output voltages from a pair of the sample circuits of FIG. 5.

As shown in FIG. 6, when the sample pulse signal changes from "L" to "H", the non-inverted and inverted output signals from the differential conversion circuit set 1 are sampled by the sample circuit set 17. Then, the non-inverted and inverted output signals from the differential conversion circuit set 1 are held by the sample circuit set 17. While the non-inverted and inverted output signals from the differential conversion circuit set 1 remain held by the sample circuit set 17, these signals are contaminated by error voltages such as pedestal offset voltages $\Delta Vp2$ and droop error voltages $\Delta Vd2$. Since the A/D conversion is performed on the basis of the differences between the non-inverted signals and the inverted signals, these error voltages can be canceled during the A/D conversion. In addition, common-mode distortions of the non-inverted and inverted signals can be removed for a similar reason.

In FIG. 6, VA and VB denote the non-inverted voltage and the inverted voltage inputted into a voltage divider 9 respectively.

Figure 7:
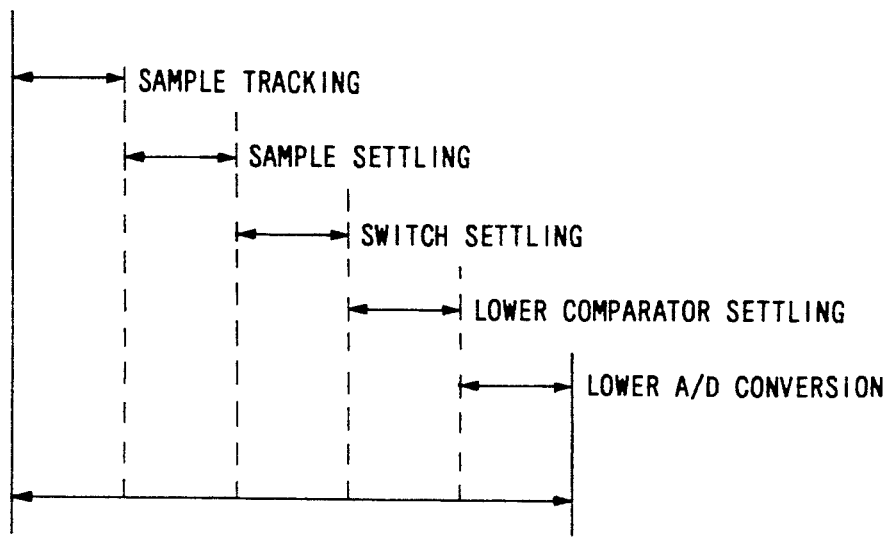
FIG. 7 is a diagram showing the contents of a conversion time in the A/D converter of FIG. 5.

As shown in FIG. 7, a conversion time is divided into first to fifth periods. The first is a tracking period during which the sample circuits follow the input signals. The second is a period for settling the sample circuits. The third is a period for settling the output signals from the switches. Until the end of the third period, the signals from the higher-order comparator set 5 are inputted into and processed by a higher-order logical circuit 6 and a selection signal is generated to settle the signals selected by the switches. The fourth is a period for settling the input signals into a lower-order comparator set 10. The fifth is a period which lasts between the moment of the generation of the output signals from the lower-order comparator set 10 and the moment of the generation of the output signal from a lower-order logical circuit 11.

DESCRIPTION OF THE THIRD PREFERRED EMBODIMENT

Figure 8:
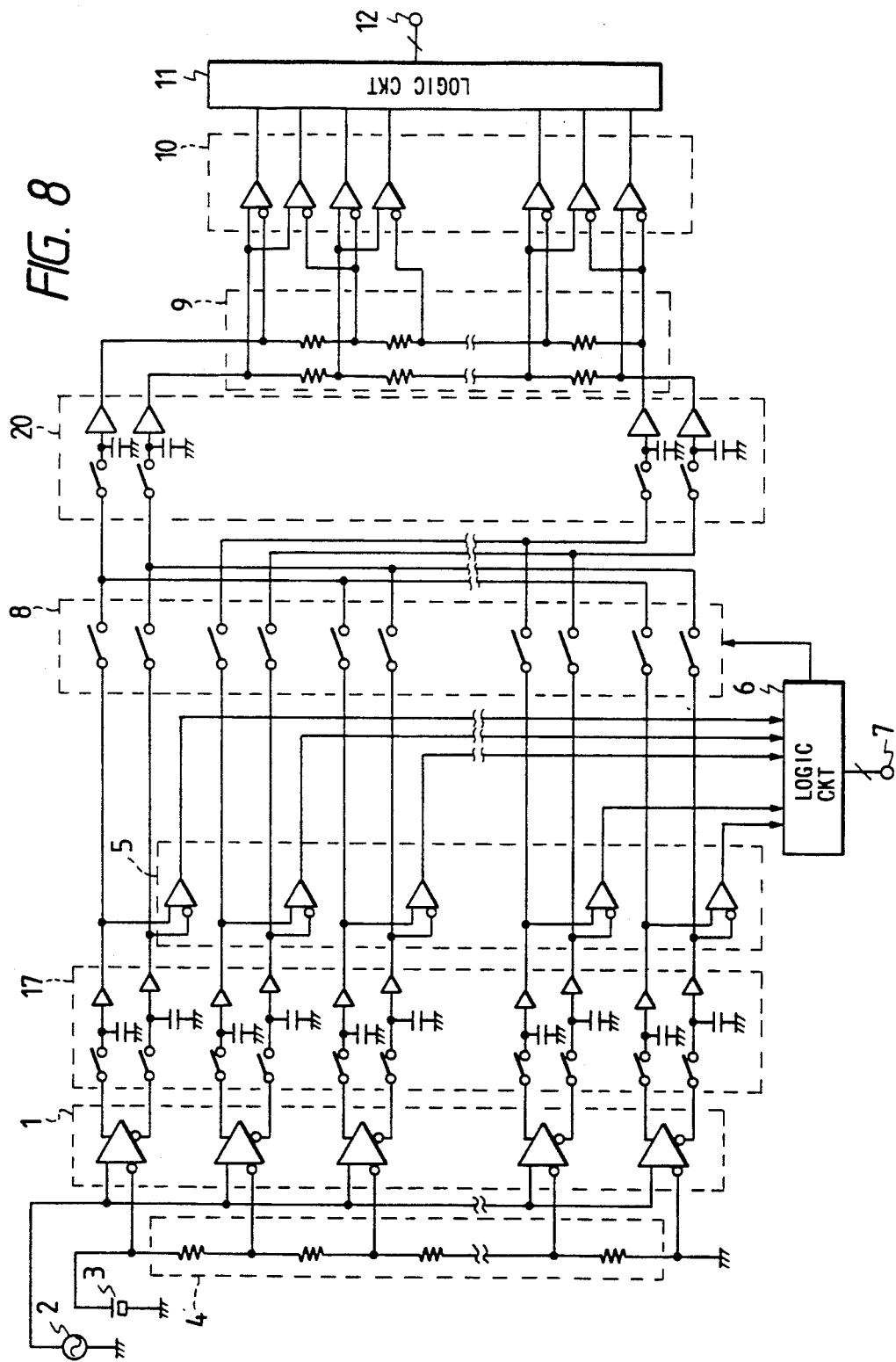
FIG. 8 is a diagram of a serial-parallel type A/D converter according to a third embodiment of this invention.

FIG. 8 shows a third embodiment of this invention which is similar to the embodiment of FIGS. 5–7 except that a set 20 of sample circuits is added between a switch set 8 and a voltage divider 9. The sample circuit set 20 samples and holds the signals fed from the switch set 8 to the voltage divider 9 in response to a sample pulse signal generated by a suitable circuit (not shown).

Figure 9:
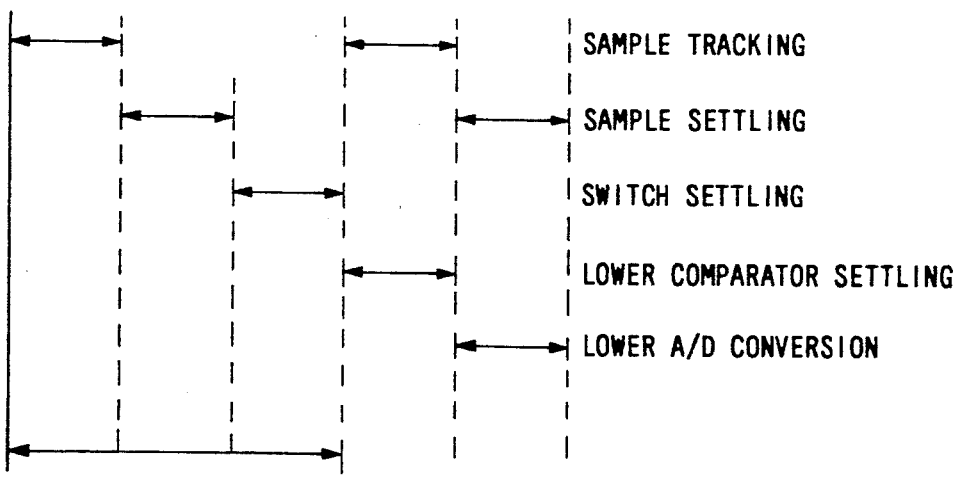
FIG. 9 is a diagram showing the contents of a conversion time in the A/D converter of FIG. 8.

As shown in FIG. 9, a conversion time is divided into first to third periods. The first is a tracking period during which the sample circuits follow the input signals. In addition, during the first period, the signals inputted into a lower-order comparator set 10 are settled. Thus, the first period corresponds to both of the first and fourth periods of FIG. 7. The second is a period for settling the sample circuits. In addition, during the second period, a lower-order part of the result of the A/D conversion is outputted. Thus, the second period corresponds to both of the second and fifth periods of FIG. 7. The third is a period for settling the output signals from the switches. Until the end of the third period, the signals from a higher-order comparator set 5 are inputted into and processed by a higher-order logical circuit 6 and a selection signal is generated to settle the signals selected by the switch set 8.

DESCRIPTION OF THE FOURTH PREFERRED EMBODIMENT

Figure 10:
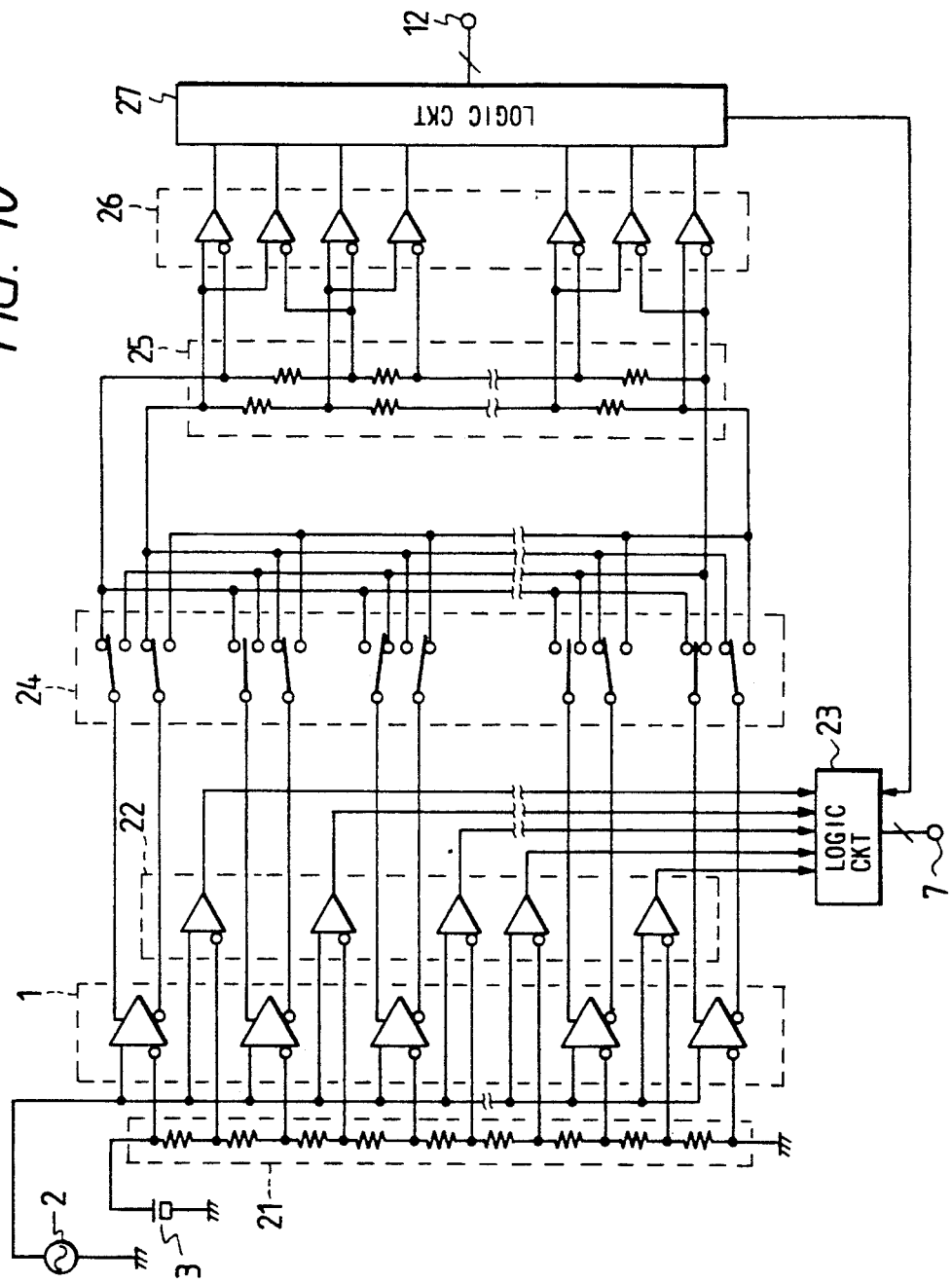
FIG. 10 is a diagram of a serial-parallel type A/D converter according to a fourth embodiment of this invention.
Figure 28:
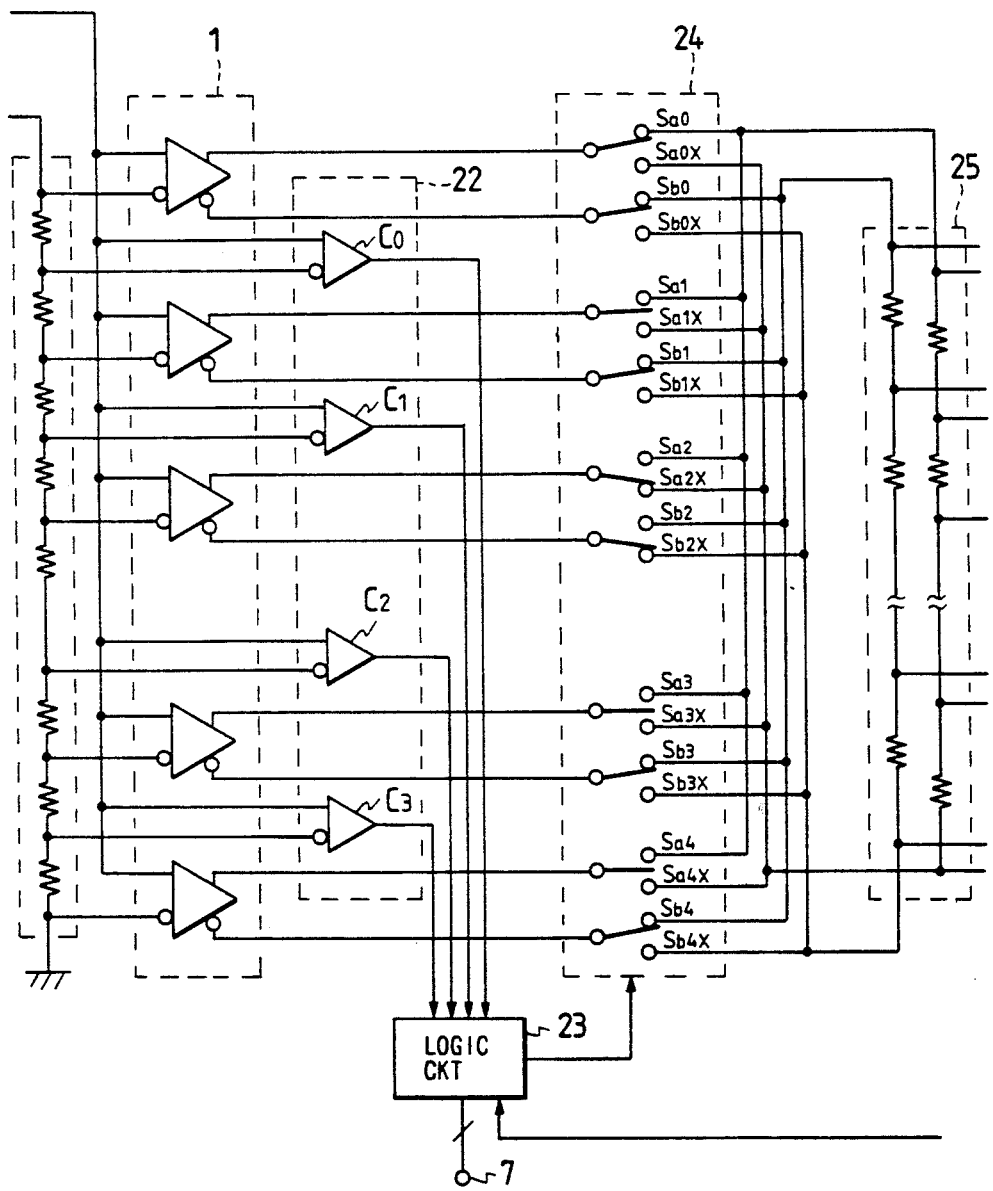
FIG. 28 is a diagram of part of the A/D converter of FIG. 10.

FIGS. 10 and 28 show a fourth embodiment of this invention which is similar to the embodiment of FIGS. 1–4 except for design changes indicated hereinafter.

In the embodiment of FIGS. 10 and 28, a set 22 of higher-order comparators are exposed to an analog input signal 2 and different reference voltages generated by a combination of a reference voltage source 3 and a voltage divider 21. Specifically, first input terminals of the higher-order comparators in the set 22 are subjected to the analog input signal. Second input terminals of the higher-order comparators in the set 22 are subjected to the reference voltages respectively. The higher-order comparators compare the voltage of the analog input signal with the reference voltages respectively.

Figure 11:
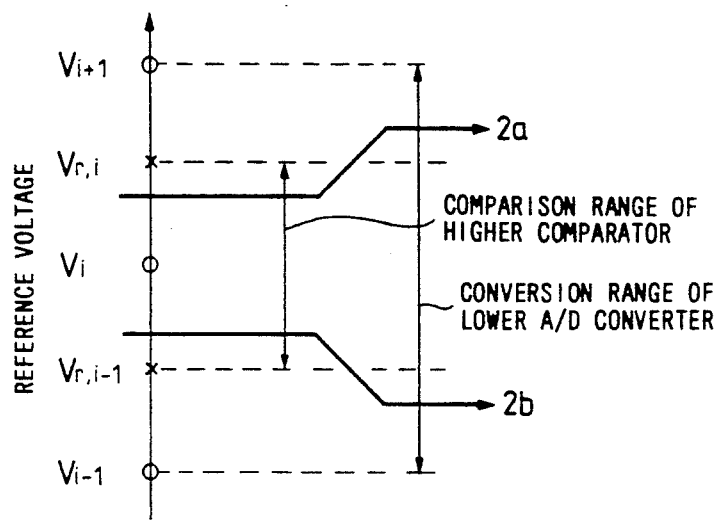
FIG. 11 is a diagram showing a comparison range of the higher-order comparator, and a conversion range of the lower-order A/D conversion circuit in the A/D converter of FIG. 10.

As shown in FIG. 11, the reference voltages Vr, i applied to the higher-order comparators are exactly intermediate between the reference voltages Vi and the adjacent reference voltages Vi+1 applied to a differential conversion circuit set 1. In the case where the voltage of the analog input signal 2 resides between the reference voltages Vr,i−1 and Vr,i, the output signals from the differential conversion circuits subjected to the reference voltages Vi−1 and Vi+1 are selected by a switch set 24 and are transmitted to a lower-order comparator set 26 to be exposed to lower-order A/D conversion. It is now assumed that the analog input signal resides within a unit comparison range of a higher-order comparator during the higher-order A/D conversion and then moves out of the unit comparison range but remains within a conversion range of a lower-order A/D conversion section during the lower-order A/D conversion as shown by the lines 2a and 2b of FIG. 11. In this case, since the analog input signal remains within the conversion range of the lower-order A/D conversion section, the lower-order A/D conversion keeps accurate.

The higher-order comparator set 22 operates similarly to the operation of the higher-order comparator set in the embodiment of FIGS. 1-4, and provides higher-order conversion values. On the basis of the higher-order comparator output signals, four of the differential conversion output signals from the differential conversion circuit set 1 are selected.

Figure 12:
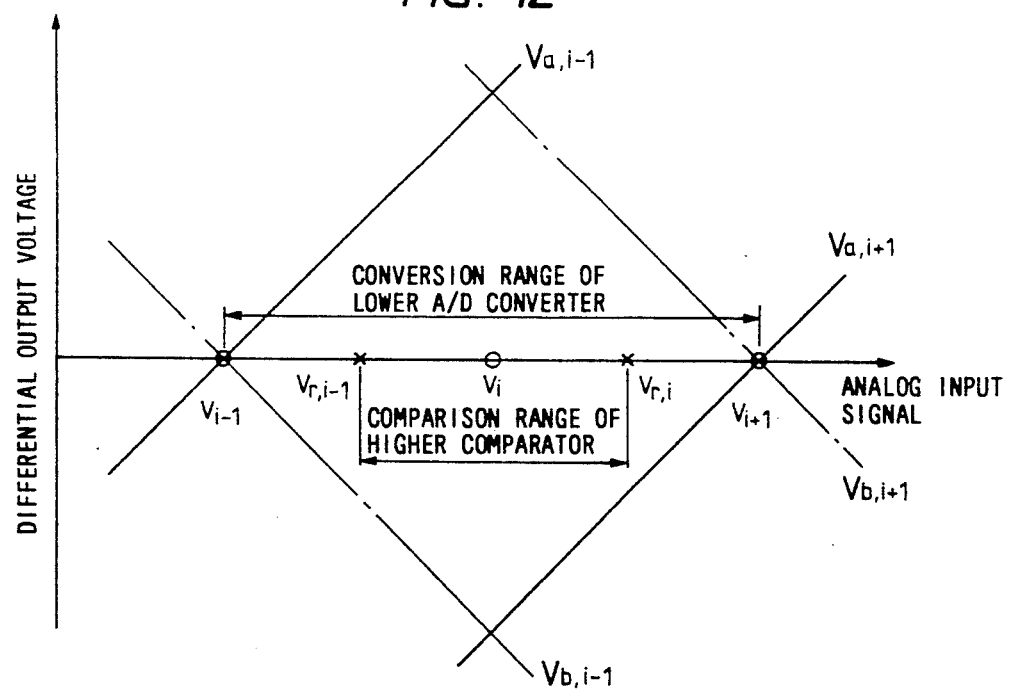
FIG. 12 is a diagram showing the relation between the analog input signal and the selected differential output voltages in the A/D converter of FIG. 10.

FIG. 12 shows condition of the selection of the differential conversion signals. In FIG. 12, the abscissa denotes an analog input signal while the ordinate denotes selected differential output voltages. The reference voltages applied to the related differential conversion circuits 1 are represented by $Vi-1$, $Vi$, and $Vi+1$. The reference voltages applied to the related higher-order comparators are represented by $Vr,i-1$ and $Vr,i$. The reference voltage $Vr,i-1$ is set exactly intermediate between the reference voltages $Vi-1$ and $Vi$ of the differential conversion circuits. The reference voltage $Vr,i$ is set exactly intermediate between the reference voltages $Vi$ and $Vi+1$ of the differential conversion circuits. Under such conditions, when the analog input signal resides between the reference voltages $Vr,i-1$ and $Vr,i$ of the higher-order comparators, the differential output voltages from the differential conversion circuits related to the reference voltages $Vi-1$ and $Vi+1$ are selected and switched by the switch set 24 so that these two differential output voltages are fed to the voltage divider 25. The lower-order A/D conversion is performed similarly to the lower-order A/D conversion in the embodiment of FIGS. 1-4. To obtain a resolution of the A/D conversion which approximately equals the resolution in the embodiment of FIGS. 1-4, the number of lower-order comparators is greater than the number of the lower-order comparators in the embodiment of FIGS. 1-4.

Figure 29:
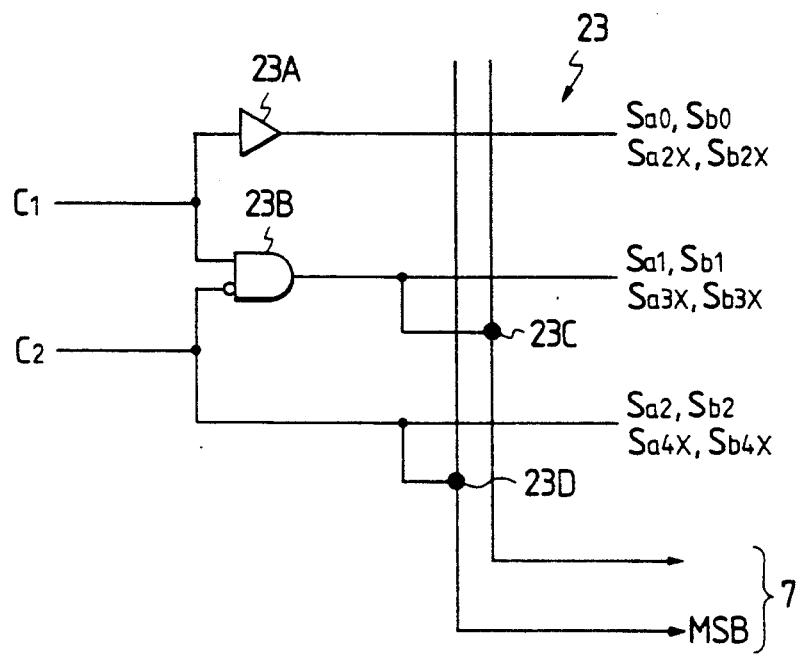
FIG. 29 is a block diagram of the higher-order logical circuit of FIG. 10.

As shown in FIG. 29, a logical circuit 23 includes a combination of an inverter 23A, an AND gate 23B, and OR gates 23C and 23D, generating selection signals and a higher-order A/D conversion output signal 7 on the basis of the output signals from the higher-order comparators C1 and C2. The selection signals are fed to the switch set 24 to control the switch set 24.

The conversion range of the lower-order A/D conversion differs from the unit comparison range of the higher-order comparators. In this embodiment, the results of the higher-order A/D conversion and the lower-order A/D conversion are added to obtain a final result of the A/D conversion. During this addition, the lowest bit of the result of the higher-order A/D conversion and the highest bit of the result of the lower-order A/D conversion are overlapped or made in equal positions. A lower-order logical circuit 27 following the lower-order comparator set 26 transfers a control signal to the higher-order logical circuit 23 so that the higher-order logical circuit 23 will output an accurate A/D conversion value.

DESCRIPTION OF THE FIFTH PREFERRED EMBODIMENT

Figure 13:
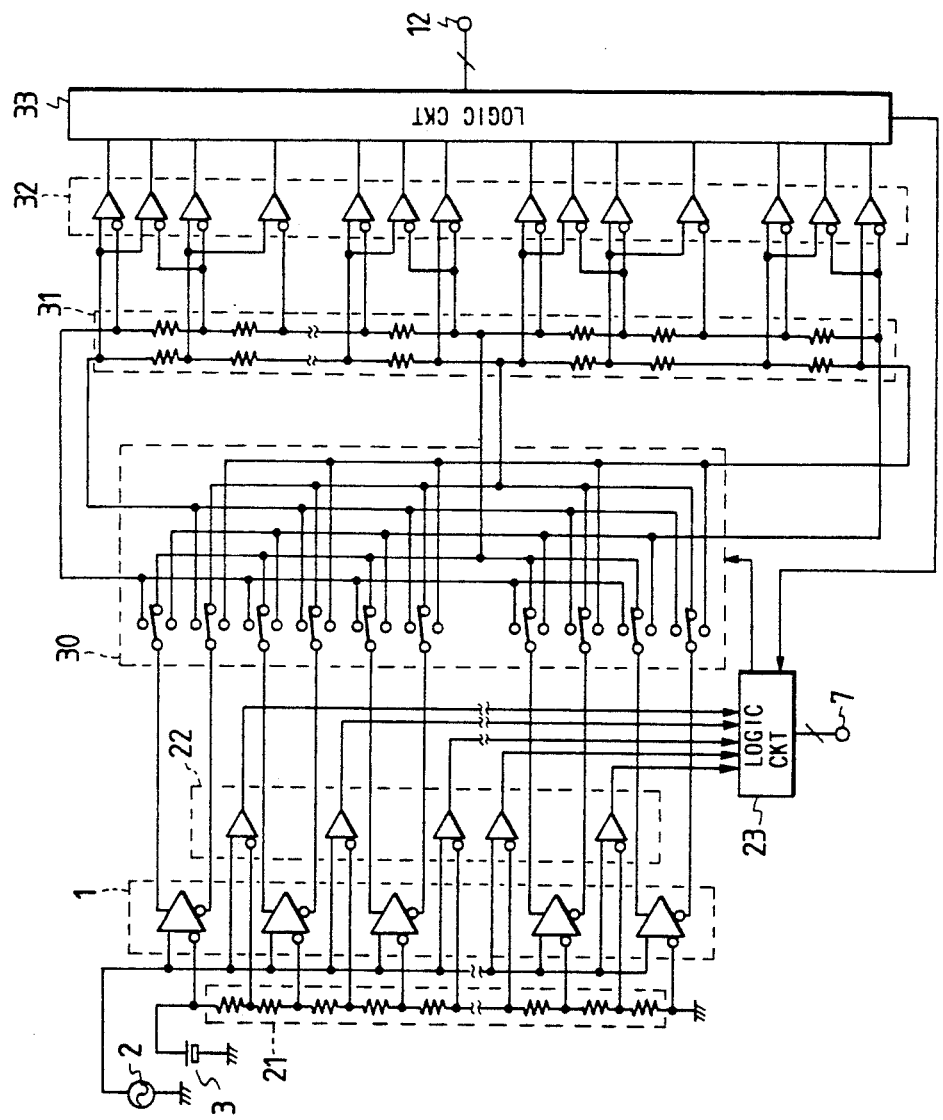
FIG. 13 is a diagram of a serial-parallel type A/D converter according to a fifth embodiment of this invention.
Figure 30:
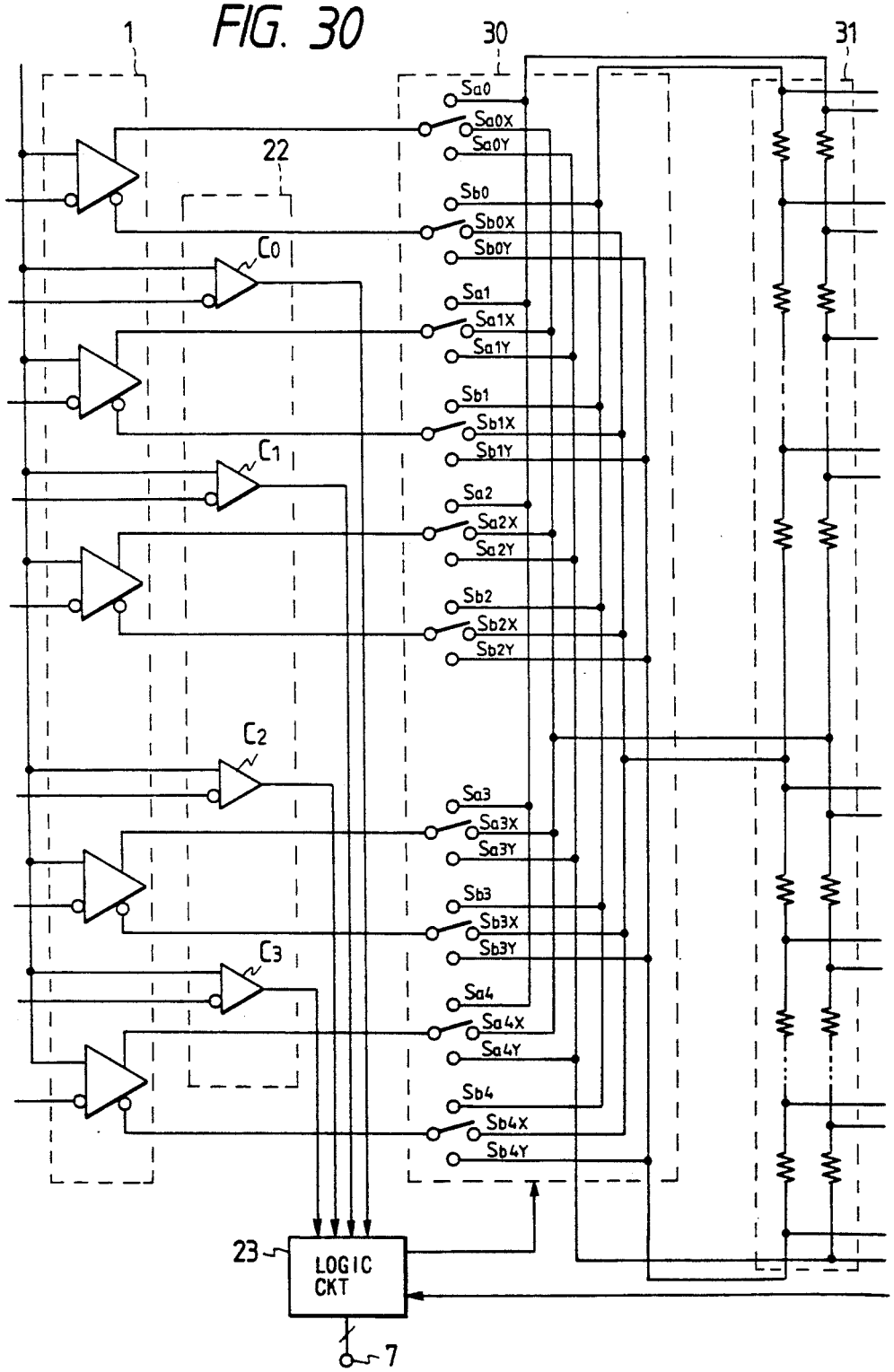
FIG. 30 is a diagram of part of the A/D converter of FIG. 13.

FIGS. 13 and 30 show a fifth embodiment of this invention which is similar to the embodiment of FIGS. 10-12 except for design changes indicated hereinafter.

In the embodiment of FIGS. 13 and 30, differential conversion output signals from a differential conversion circuit set 1 are selected, and the selected signals are inputted into a voltage divider 31 as follows.

Figure 14:
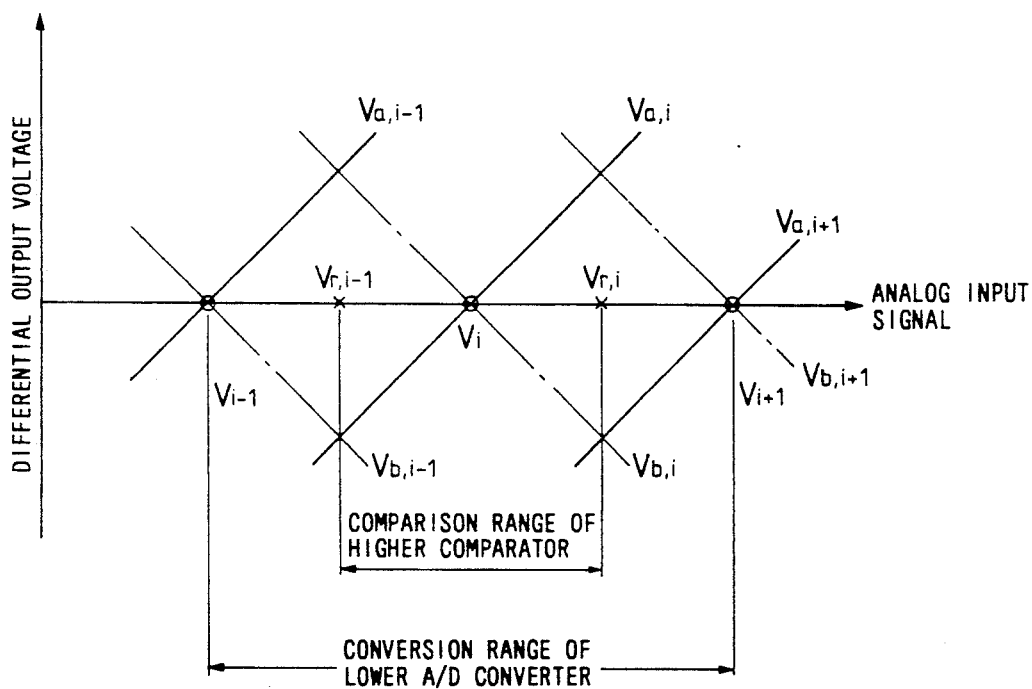
FIG. 14 is a diagram showing the relation between the analog input signal and the selected differential output voltages in the A/D converter of FIG. 13.

FIG. 14 shows conditions of the selection of the differential conversion signals. In FIG. 14, the abscissa denotes an analog input signal while the ordinate denotes selected differential output voltages. When the analog input signal resides between the reference voltages $Vr,i-1$ and $Vr,i$ of the higher-order comparators, the three adjacent differential output voltages of the differential conversion circuit set 1 are selected and are changed by a switch set 30 so that the three differential output voltages are fed to a voltage divider 31.

Figure 31:
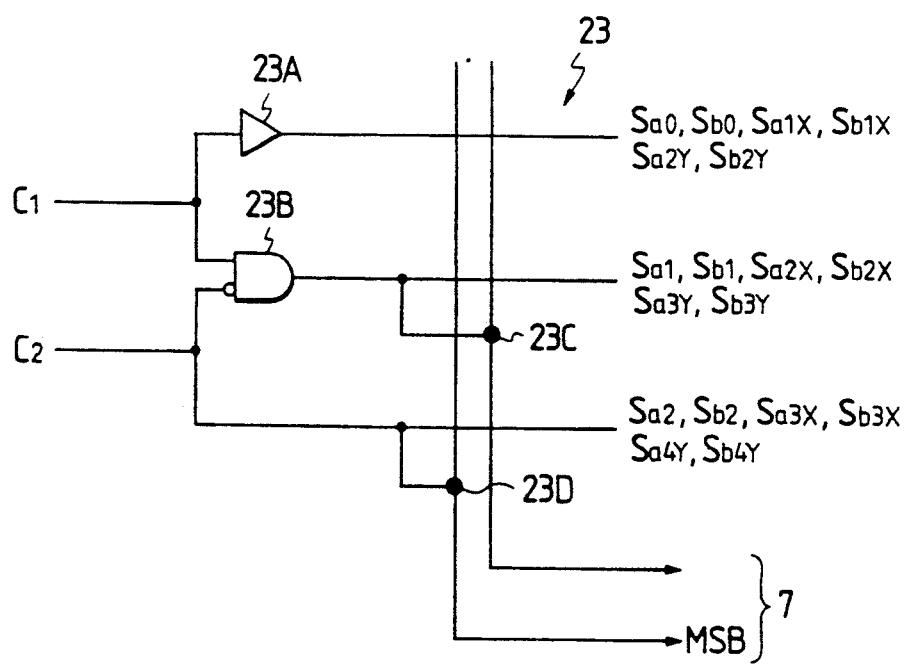
FIG. 31 is a block diagram of the higher-order logical circuit of FIG. 13.

As shown in FIG. 31, a logical circuit 23 includes a combination of an inverter 23A, an AND gate 23B, and OR gates 23C and 23D, generating selection signals and a higher-order A/D conversion output signal 7 on the basis of the output signals from the higher-order comparators C1 and C2. The selection signals are fed to the switch set 30 to control the switch set 30.

A lower-order comparator set 32 is divided into first and second parts. The first part compares the differential output voltages $Va,i-1$ and $Vb,i-1$ of the differential conversion circuit related to the reference voltage $Vi-1$ with the differential output voltages $Va,i$ and $Vb,i$ of the differential conversion circuit related to the reference voltage $Vi$. The second part compares the differential output voltages $Va,i$ and $Vb,i$ of the differential conversion circuit related to the reference voltage $Vi$ with the differential output voltages $Va,i+1$ and $Vb,i+1$ of the differential conversion circuit related to the reference voltage $Vi+1$. Furthermore, the differential output voltages are divided, and finer comparisons are performed in a manner similar to the manner of FIG. 3. A comparison output signal from the lower-order comparator set 32 is inputted into a lower-order logical circuit 33, and a lower-order A/D conversion output signal is generated by the lower-order logical circuit 33.

DESCRIPTION OF THE SIXTH PREFERRED EMBODIMENT

Figure 15:
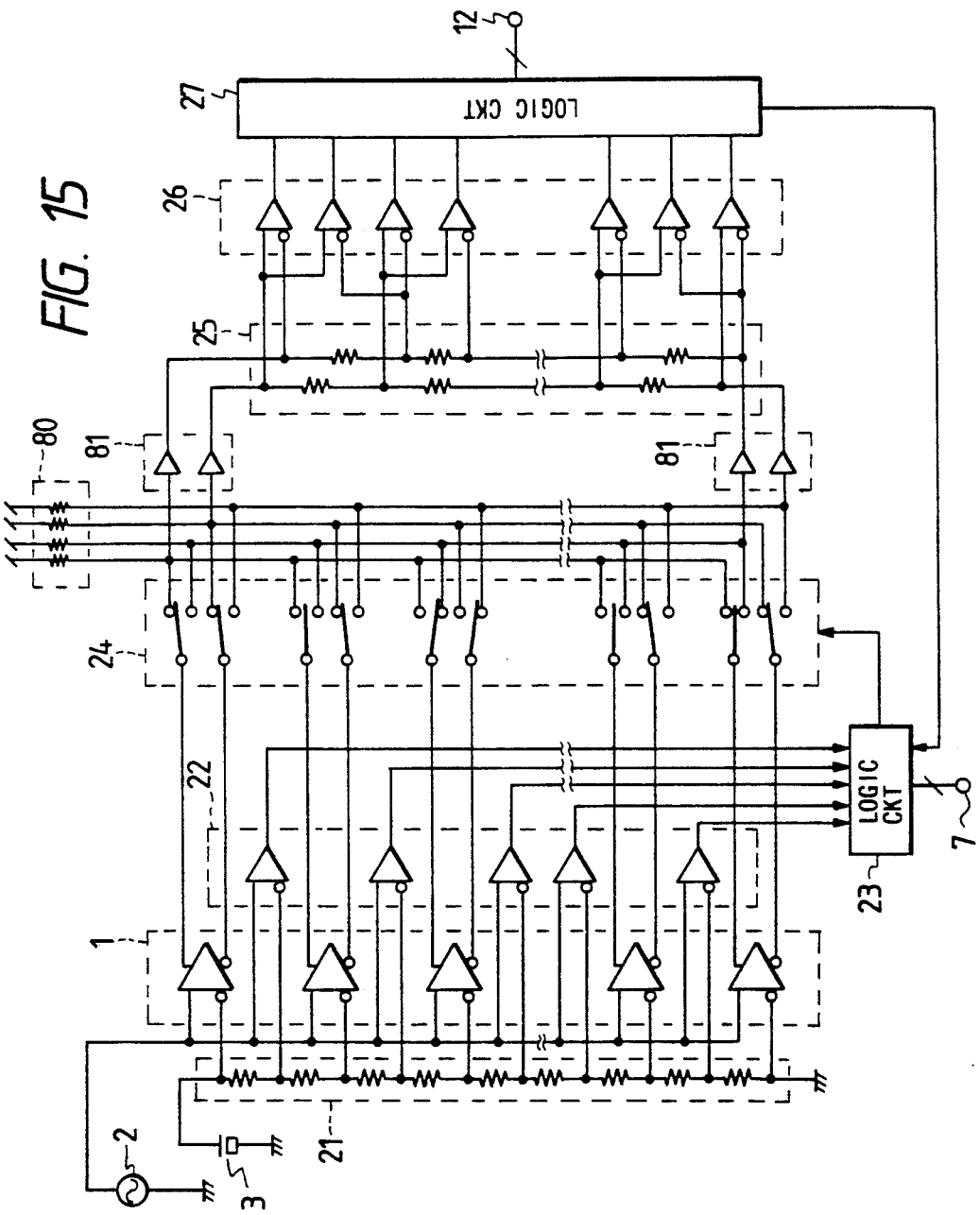
FIG. 15 is a diagram of a serial-parallel type A/D converter according to a sixth embodiment of this invention.

FIG. 15 shows a sixth embodiment of this invention which is similar to the embodiment of FIGS. 10-12 except for the following points. In the embodiment of FIG. 15, a differential conversion circuit set 1 generates differential output currents fed to a switch set 24. A set 80 of load resistors is connected to lines between the switch set 24 and a voltage divider 25 to convert the differential currents into corresponding differential voltages which are fed to the voltage divider 25 via buffers 81.

DESCRIPTION OF THE SEVENTH PREFERRED EMBODIMENT

Figure 16:
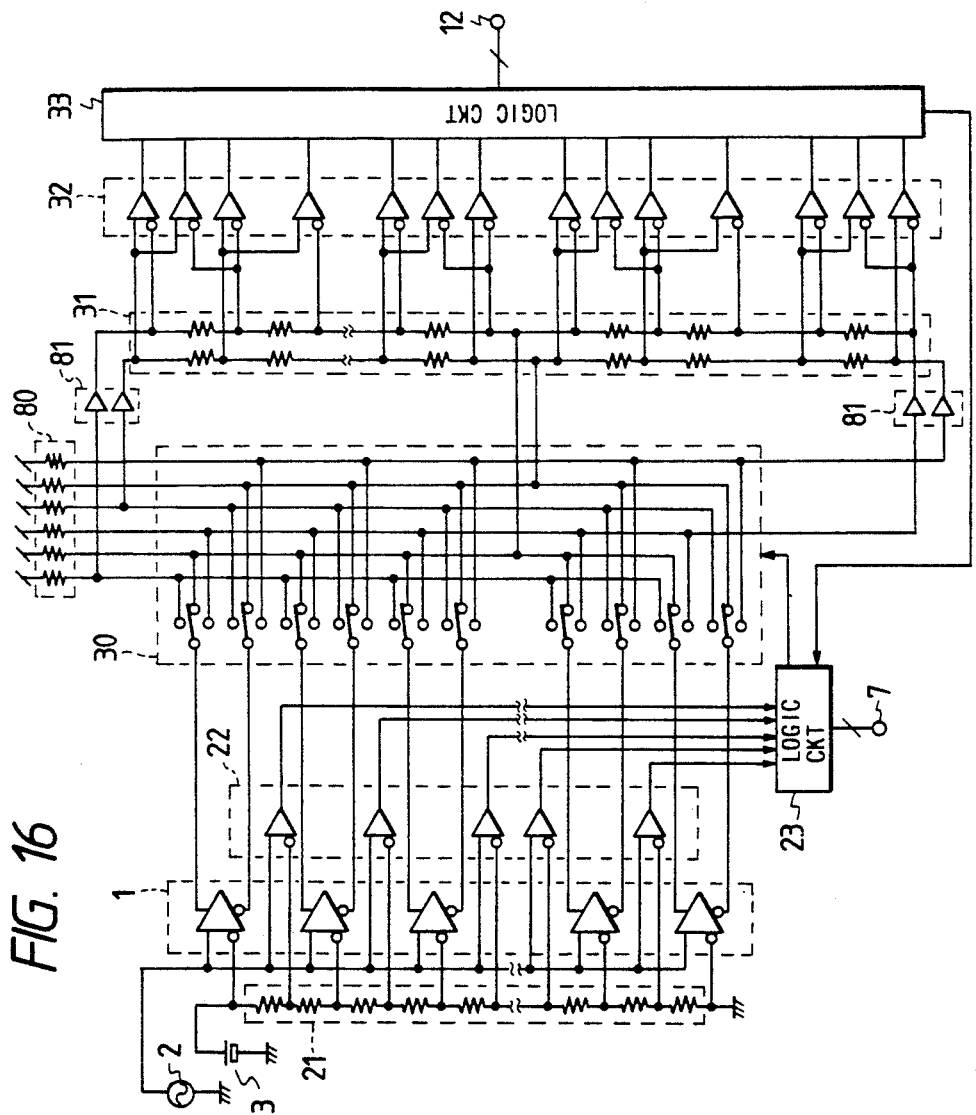
FIG. 16 is a diagram of a serial-parallel type A/D converter according to a seventh embodiment of this invention.

FIG. 16 shows a seventh embodiment of this invention which is similar to the embodiment of FIGS. 13 and 14 except for the following points. In the embodiment of FIG. 16, a differential conversion circuit set 1 generates differential output currents fed to a switch set 30. A set 80 of load resistors is connected to lines between the switch set 30 and a voltage divider 31 to convert the differential currents into corresponding differential voltages which are fed to the voltage divider 31 via buffers 81.

DESCRIPTION OF THE EIGHTH PREFERRED EMBODIMENT

Figure 17:
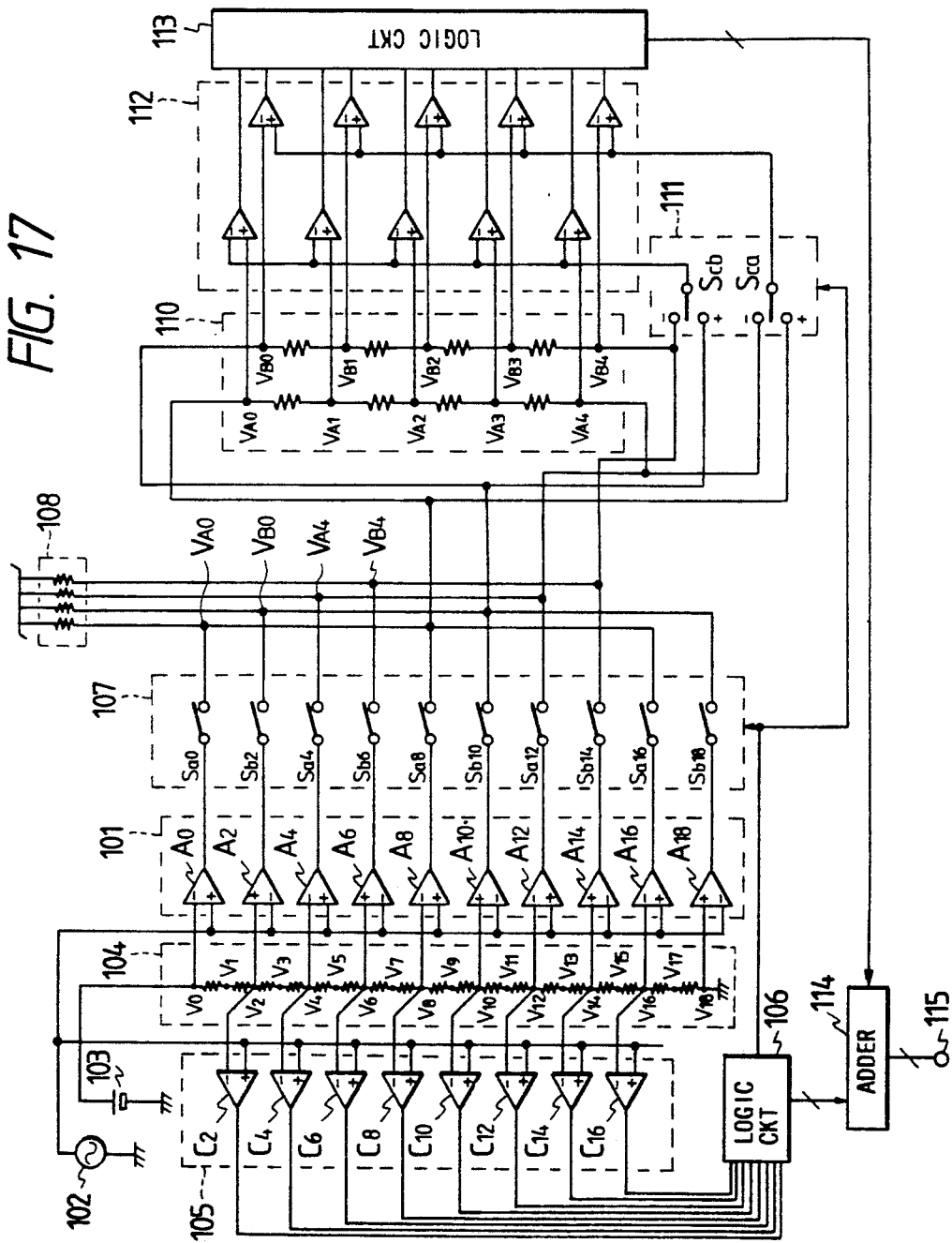
FIG. 17 is a diagram of a serial-parallel type A/D converter according to an eighth embodiment of this invention.

With reference to FIG. 17, a serial-parallel type A/D converter includes a set 101 of differential conversion circuits each converting a difference between voltages at its two input terminals into a corresponding output current. First input terminals of the differential conversion circuit set 101 are subjected in common to an analog input signal 102. Second input terminals of the differential conversion circuit set 101 are subjected to reference voltages respectively. The reference voltages are generated by dividing a voltage of a reference voltage source 103 by a voltage divider 104 including a series combination of equal resistors.

First input terminals of comparators in a higher-order comparator set 105 are subjected to voltages at voltage division points of the voltage divider 104 respectively. Second input terminals of the comparators in the higher-order comparator set 105 are subjected in common to the analog input signal 102. The comparison output signals from the higher-order comparator set 105 are fed to a higher-order logical circuit 106. The output signal from the higher-order logical circuit 106 is determined in dependence upon the comparison signals fed from the higher-order comparator set 105.

In addition, the higher-order logical circuit 106 generates a selection signal in dependence upon the comparison signals fed from the higher-order comparator set 105. The selection signal is fed from the higher-order logical circuit 106 to a first switch set 107. The first switch set 107 selects four of the output currents from the differential conversion circuit set 101 in response to the selection signal, so that voltages corresponding to the selected output currents are generated at a set 108 of load resistors. The generated voltages are fed to a voltage divider 110, and are divided by the voltage divider 110.

A second switch set 111 selects given ones of the divided voltages in response to the selection signal fed from the logical circuit 106. Comparators in a lower-order comparator set 112 compare the divided voltages with the output voltages from the second switch set 111. The comparison output signals from the lower-order comparator set 112 are fed to a lower-order logical circuit 113. The output signal from the lower-order logical circuit 113 is determined by the comparison signals fed from the lower-order comparator set 112. The output signals from the logical circuits 106 and 113 are added by an adder 114, so that an A/D conversion output signal 115 is obtained by the adder 114.

Figure 18:
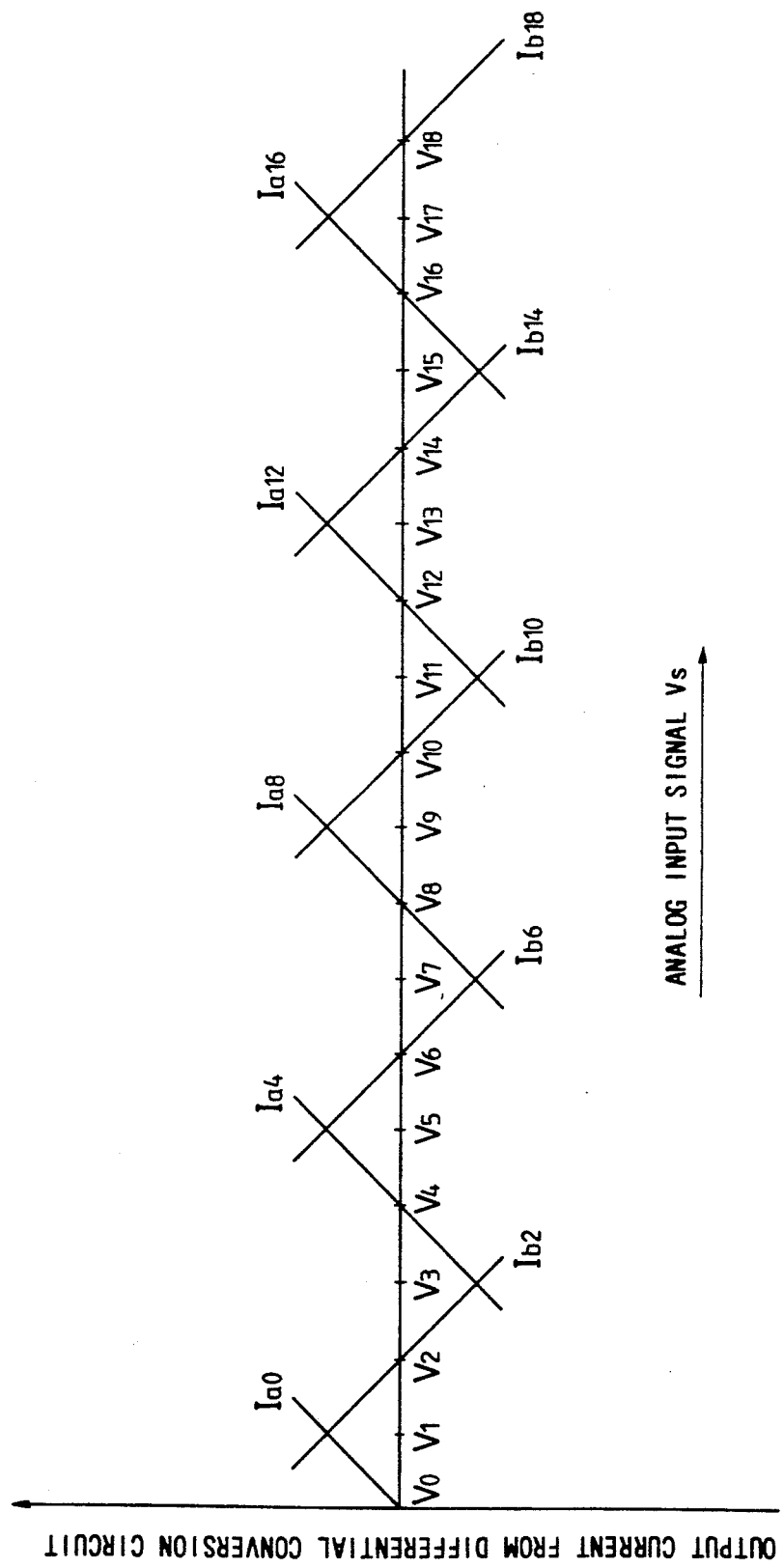
FIG. 18 is a diagram showing the relation between the analog input signal and the output currents from the differential conversion circuits in the A/D converter of FIG. 17.

In FIG. 18, the reference voltages applied to the differential conversion circuits A0, A2, ..., A18 are denoted by the characters V0, V2, ..., V18 respectively. The output currents Ia0, Ia4, ..., Ia16, Ib2, Ib6, ..., Ib18 from the differential conversion circuits are given by the following equations at ranges close to the respective reference voltages.

$$Iai = g(Vs - Vi) + Ib \quad (i = 0, 4, \ldots, 16) \quad (1)$$

$$Ibi = -g(Vs - Vi) + Ib \quad (i = 2, 6, \ldots, 18) \quad (2)$$

where "g" denotes a mutual conductance of the differential conversion circuits and Ib denotes a bias current.

Figure 19:
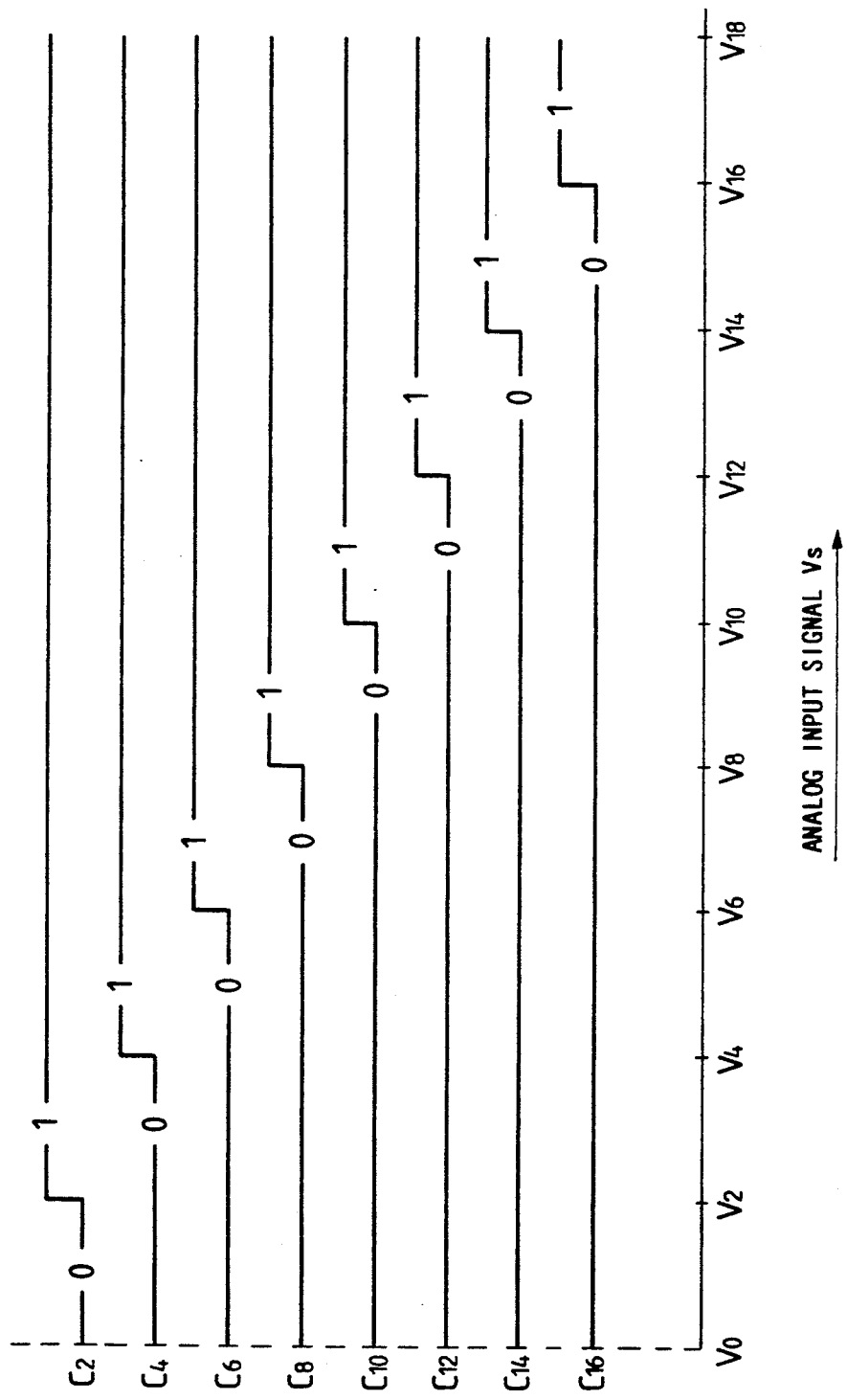
FIG. 19 is a diagram showing the relation between the analog input signal and the output signals from the higher-order comparators in the A/D converter of FIG. 17.

FIG. 19 shows the relation between the voltage Vs of the analog input signal 102 and the comparison output signals from the comparators C2-C16 in the higher-order comparator set 105. In FIG. 19, the comparison output signals from the comparators C2-C16 are also denoted by the characters C2-C16 respectively for an easy understanding. The comparison output signals from the comparators C2-C16 are given by the following equation.

$$Ci = sgn(Vs - Vi) \quad (i = 1, 2, \ldots, 16) \quad (3)$$

where sgn denotes a function defined as follows.

$sgn(x) = 1$ when $x \geq 0$
$sgn(x) = 0$ when $x < 0$

As understood from the equation (3), the comparison output signal from each of the comparators is "1" when the input signal is greater than the related reference voltage. Thus, the comparison output signals are inputted into the higher-order logical circuit 106, and thereby a higher-order A/D conversion output signal is obtained.

Figure 20:
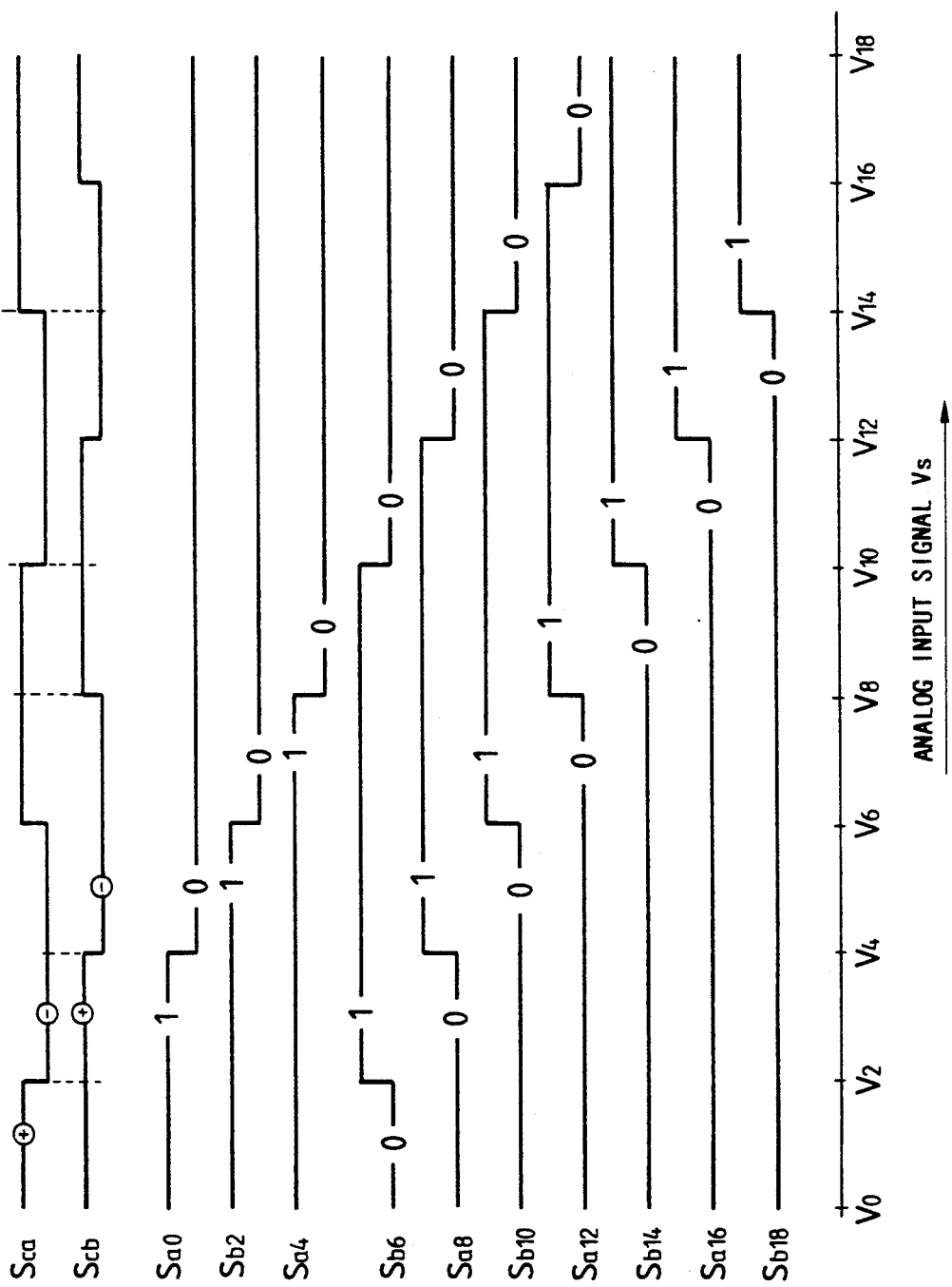
FIG. 20 is a diagram showing the relation between the analog input signal and the states of the switches in the A/D converter of FIG. 17.

FIG. 20 shows ON and OFF states of respective switches in the first switch set 107, and conditions of respective switches in the second switch set 111. In FIG. 20, "1" means an ON state, and "0" means an OFF state. In addition, "+" denotes the connection to a "+" terminal, and "−" denotes the connection to a "−" terminal.

As described previously, the differential conversion circuit set 101 generates output currents which are linearly dependent on the voltage level of the analog input signal 102, and the output currents are selectively switched.

Lower-order A/D conversion is performed by use of the above-mentioned output currents as follows. The output currents from the differential conversion circuit set 101 are transmitted via the first switch set 107 to the load resistor set 108, and are converted into corresponding voltages.

Figure 21:
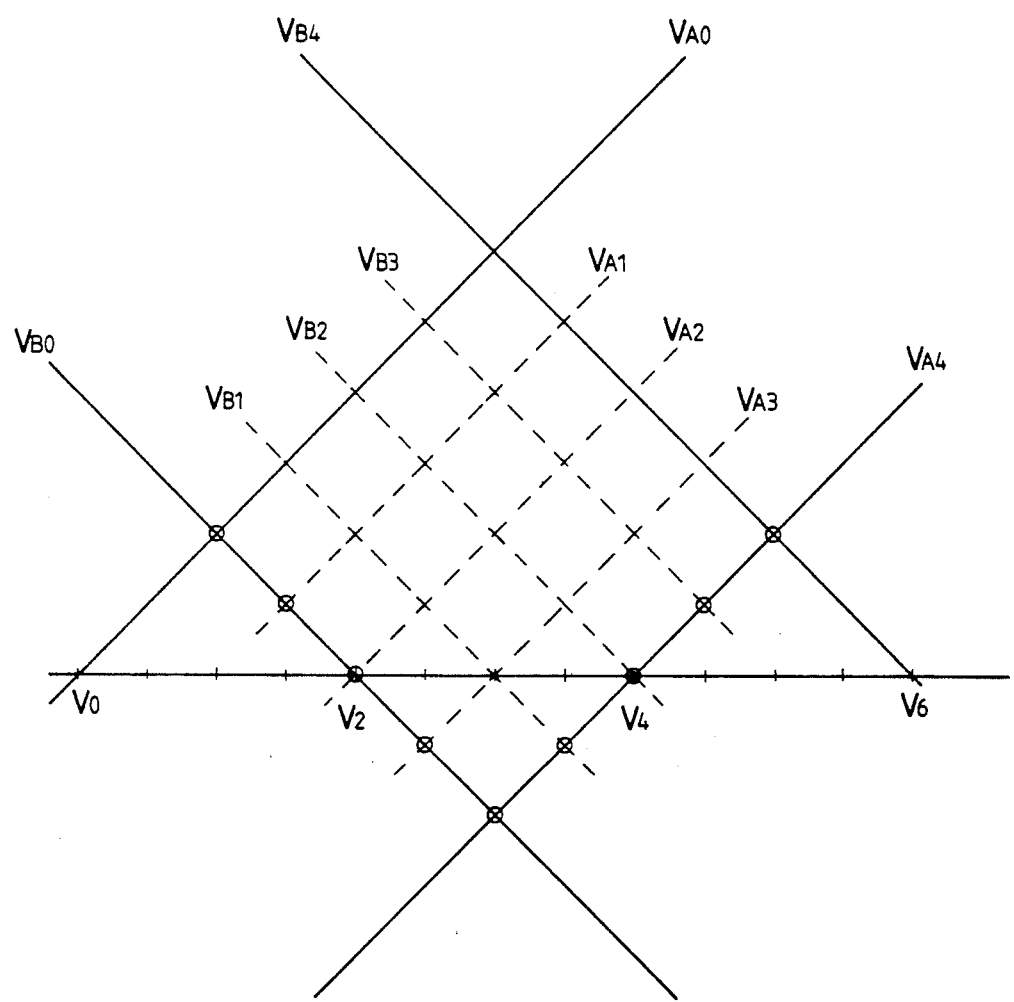
FIG. 21 is a diagram showing conditions of the lower-order A/D conversion in the A/D converter of FIG. 17.
Figure 22:
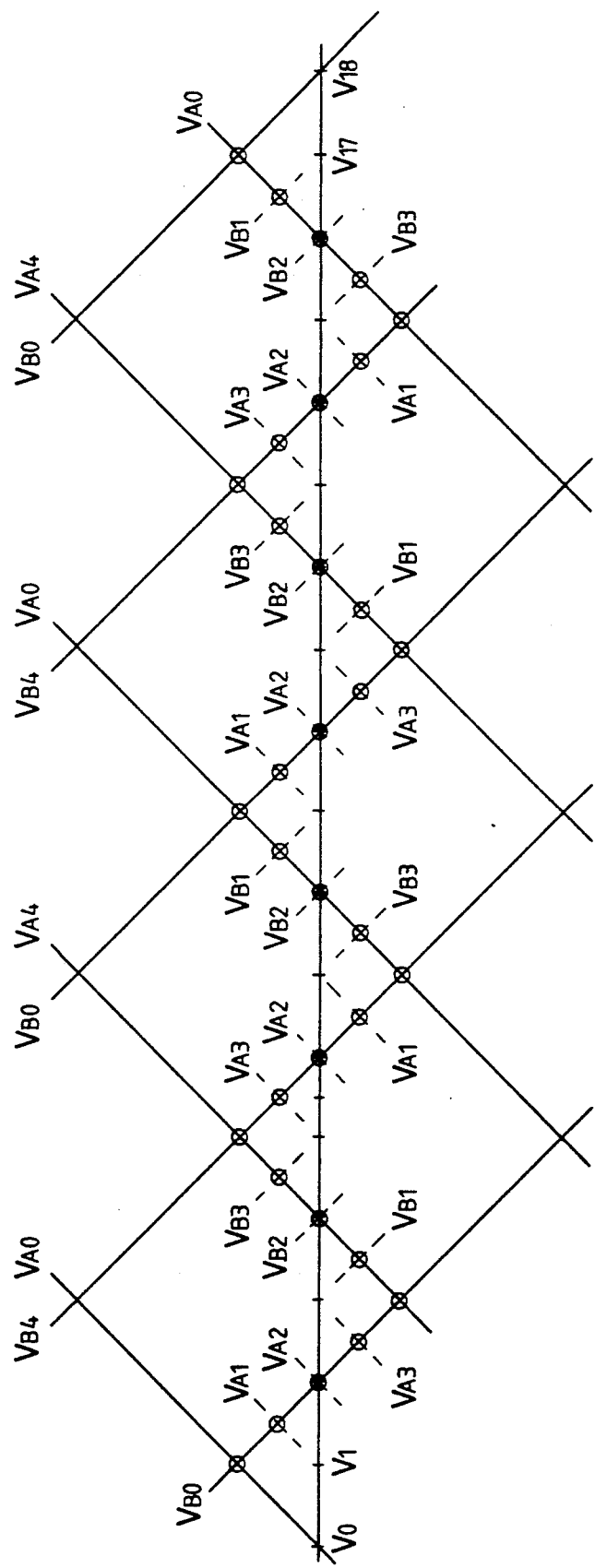
FIG. 22 is a diagram showing conditions of the lower-order A/D conversion over the entire range of the analog input signal in the A/D converter of FIG. 17.

FIG. 21 shows an example of the relation between the analog input signal 102 and voltages generated at respective nodes in the voltage divider 110. In the example of FIG. 21, the resolution of the lower-order A/D conversion corresponds to three bits and the voltage of the analog input signal 102 resides between V2 and V4. The voltage divider 110 includes first and second series combination of equal resistors. The output currents from four selected adjacent differential conversion circuits are converted by the load resistor set 108 into corresponding voltages respectively. The intervals between these voltages are divided by the voltage divider 110 so that divided voltages VA1-VA3 and VB1-VB4 are generated. The polarity of an increase and a decrease in the voltages VA0-VA4 and the polarity of an increase and a decrease in the voltages VB0-VB4 are uniquely determined by the level of the analog input signal 102. FIG. 22 shows conditions of the voltages VA0-VA4 and VB0-VB4 over the entire range of the analog input signal 102. The minimal voltage range of the higher-order A/D conversion is expanded by a factor of 2, and the 3-bit lower-order A/D conversion is performed.

DESCRIPTION OF THE NINTH PREFERRED EMBODIMENT

Figure 23:
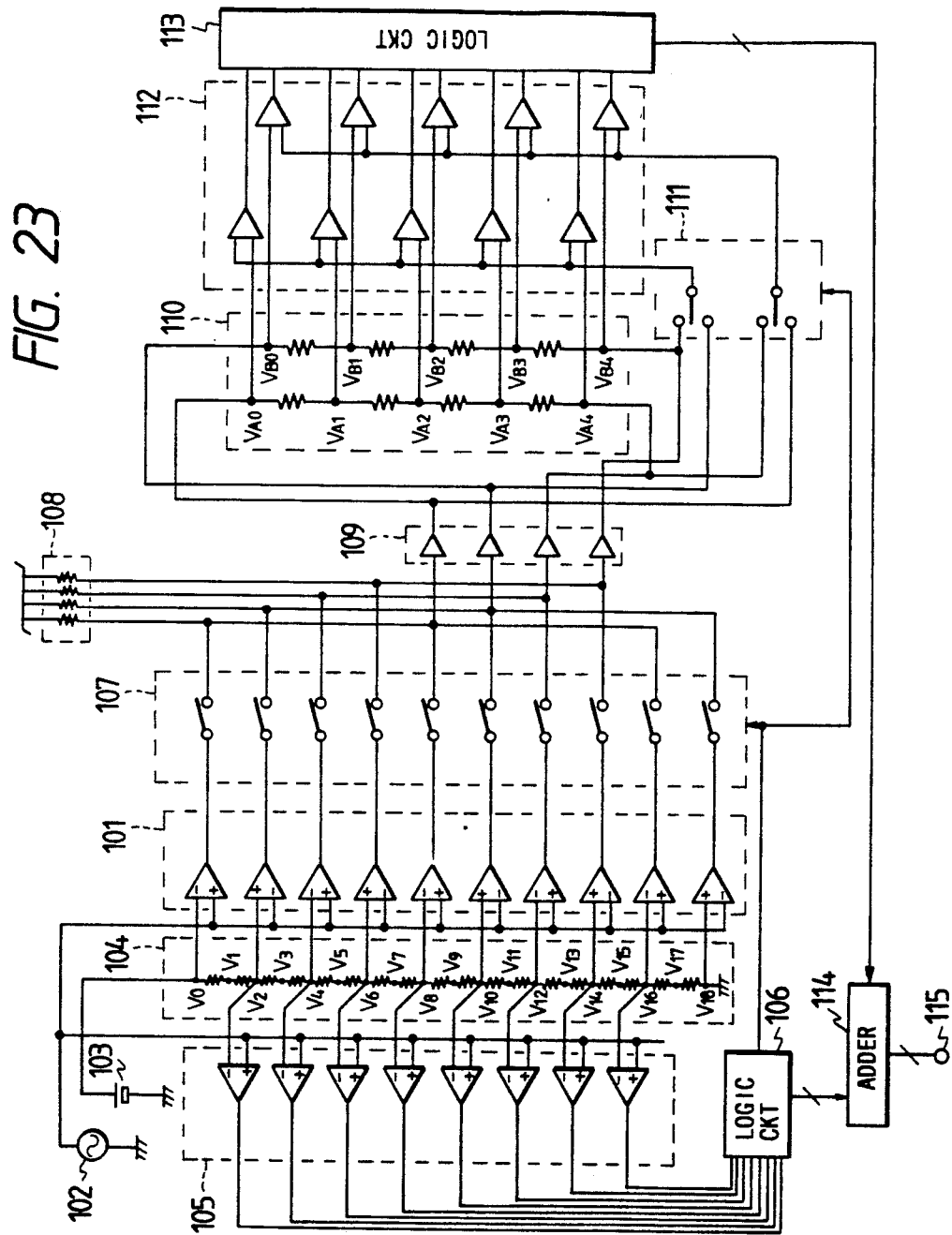
FIG. 23 is a diagram of a serial-parallel type A/D converter according to a ninth embodiment of this invention.

FIG. 23 shows a ninth embodiment of this invention which is similar to the embodiment of FIGS. 17-22 except that a set 109 of buffers is added between a load resistor set 108 and a voltage divider 110 to prevent unwanted leakage of currents to the voltage divider 110.

DESCRIPTION OF THE TENTH PREFERRED EMBODIMENT

Figure 24:
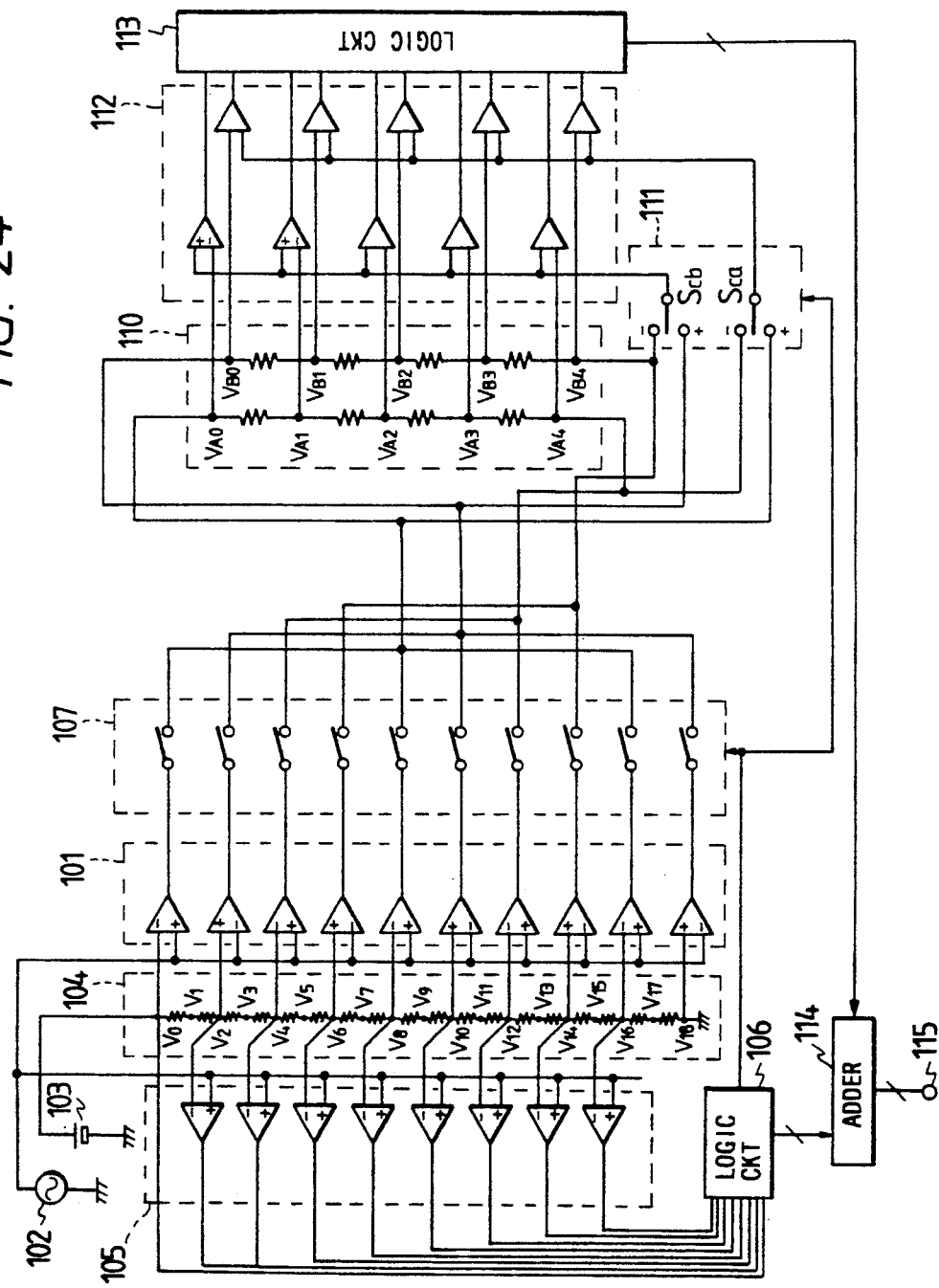
FIG. 24 is a diagram of a serial-parallel type A/D converter according to a tenth embodiment of this invention.

FIG. 24 shows a tenth embodiment of this invention which is similar to the embodiment of FIGS. 17-22 except that the load resistor set 108 (see FIG. 17) is removed.

DESCRIPTION OF THE ELEVENTH PREFERRED EMBODIMENT

Figure 25:
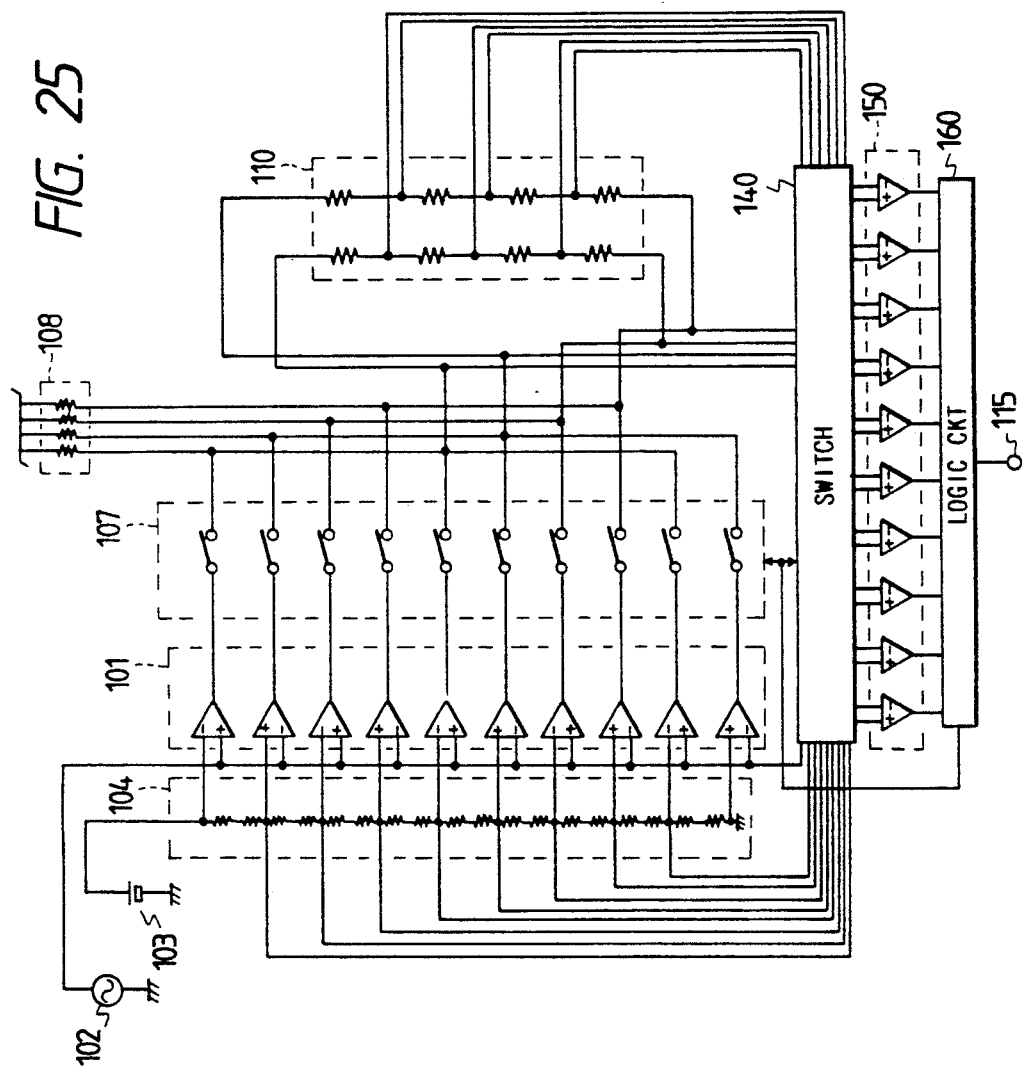
FIG. 25 is a diagram of a serial-parallel type A/D converter according to an eleventh embodiment of this invention.

FIG. 25 shows an eleventh embodiment of this invention which is similar to the embodiment of FIGS. 17-22 except for the following design changes. In the embodiment of FIG. 25, a switch set 140 is provided between a voltage divider 104, a voltage divider 110, and a comparator set 150. The comparator set 150 is selectively used in higher-order A/D conversion and lower-order A/D conversion in a time division manner. Specifically, during a period of the higher-order A/D conversion, voltages outputted from the voltage divider 104 are fed to the comparator set 150 via the switch set 140. During a period of the lower-order A/D conversion, voltages outputted from the voltage divider 110 are fed to the comparator set 150 via the switch set 140. The switch set 140 includes a section corresponding to the second switch set 111 of FIG. 17.

A conversion logical circuit 160 following the comparator set 150 converts the output signals from the comparator set 150 into a corresponding A/D conversion output signal 115.

Figure 26:
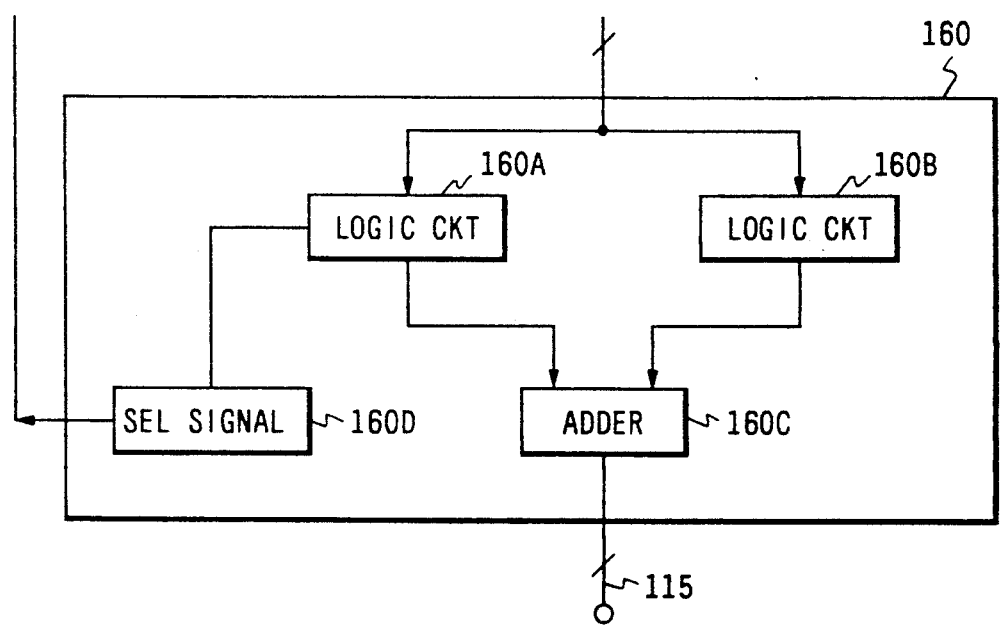
FIG. 26 is a block diagram of the conversion logical circuit of FIG. 25.

As shown in FIG. 26, the conversion logical circuit 160 includes logical circuits 160A and 160B receiving the output signals from the comparator set 150. The logical circuits 160A and 160B correspond to the logical circuits 106 and 113 of FIG. 17 respectively. The conversion logical circuit 160 also includes an adder 160C adding the output signals of the logical circuits 160A and 160B into the A/D conversion output signal 115. The adder 160C corresponds to the adder 114 of FIG. 17. The conversion logical circuit 160 further includes a section 160D which generates a selection signal in dependence upon an output signal from the logical circuit 160A, and the selection signal is outputted to a first switch set 107 and the switch set 140. The switch sets 107 and 140 are controlled by the selection signal fed from the conversion logical circuit 160.

DESCRIPTION OF THE TWELFTH PREFERRED EMBODIMENT

Figure 27:
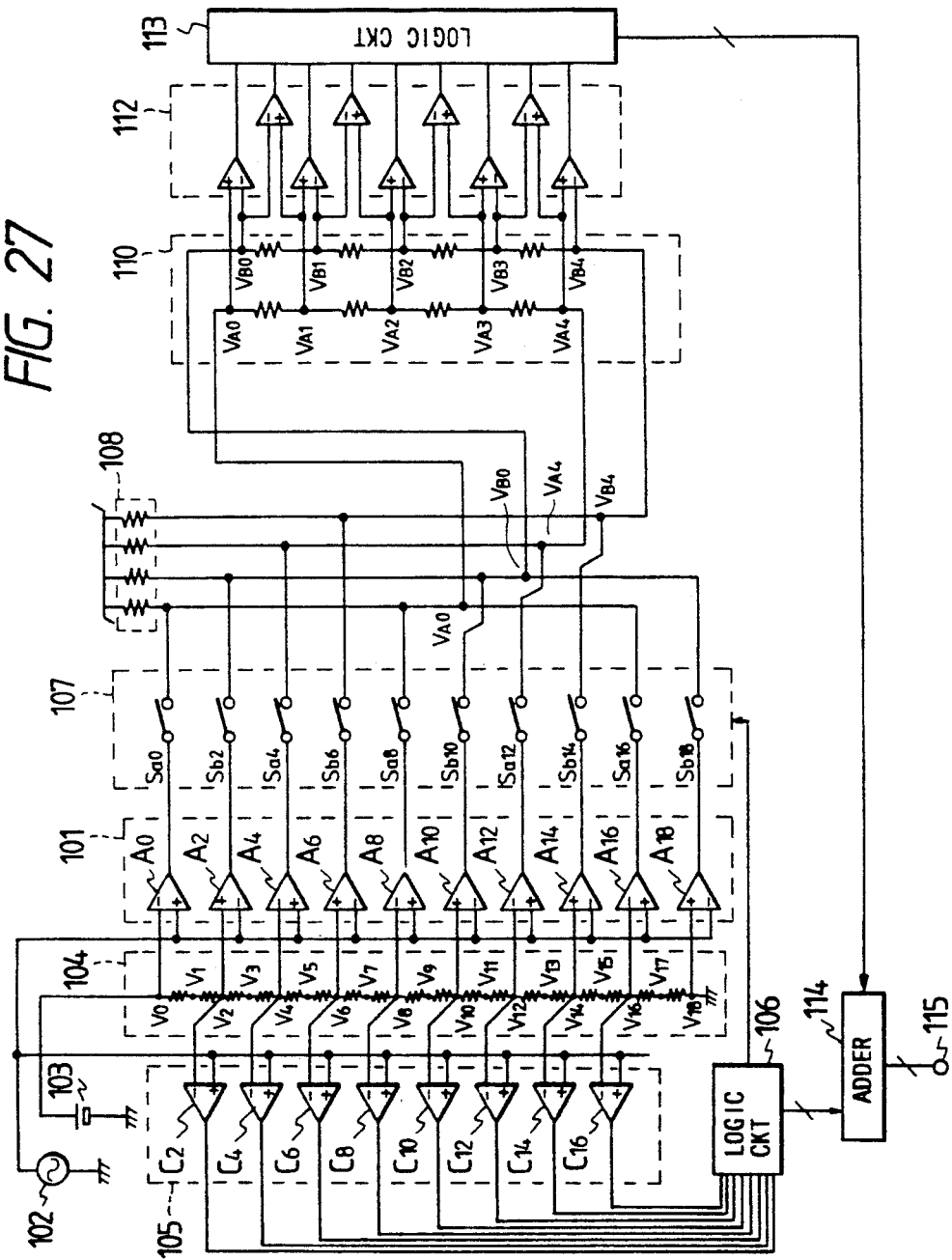
FIG. 27 is a diagram of a serial-parallel type A/D converter according to a twelfth embodiment of this invention.

FIG. 27 shows an eleventh embodiment of this invention which is similar to the embodiment of FIGS. 17-22 except for the following design changes. In the embodiment of FIG. 27, the second switch set 111 is removed, and voltages generated at respective nodes of a voltage divider 110 are inputted into comparators of a lower-order comparator set 112.

What is claimed is:

1. A serial-parallel type A/D converter comprising:
   means for generating a plurality of different reference voltages;
   a set of differential conversion circuits having first input terminals subjected in common to an analog input signal and second input terminals subjected to the respective reference voltages, and converting differences between voltages at the first and second input terminals into differential output voltages;
   a first A/D conversion circuit comparing the analog input signal with the reference voltages to perform a higher-order A/D conversion of the input analog signal;
   means for selecting at least two of the differential output voltages;
   means for dividing an interval between the differential output voltages selected by the selecting means, and for generating divided voltages in accordance with said dividing; and
   a second A/D conversion circuit comparing the divided voltages to perform a lower-order A/D conversion of the analog input signal.

2. A serial-parallel type A/D converter comprising:
   means for generating a plurality of different reference voltages;
   a set of differential conversion circuits having first input terminals subjected in common to an analog input signal and second input terminals subjected to the respective reference voltages, and converting differences between voltages at the first and second input terminals into differential output voltages;
   a set of sample circuits sampling the differential output voltages and outputting sampled differential output voltages;
   a first A/D conversion circuit comparing the analog input signal with the reference voltages to perform a higher-order A/D conversion of the input analog signal;
   means for selecting at least two of the sampled differential output voltages;
   means for dividing an interval between the sampled differential output voltages selected by the selecting means, and for generating divided voltages in accordance with said dividing; and
   a second A/D conversion circuit comparing the divided voltages to perform a lower-order A/D conversion of the analog input signal.

3. A serial-parallel type A/D converter comprising:
   means for generating a plurality of different reference voltages;
   a set of differential conversion circuits having first input terminals subjected in common to an analog input signal and second input terminals subjected to the respective reference voltages, and converting differences between voltages at the first and second input terminals into differential output voltages;
   a set of first sample circuits sampling the differential output voltages and outputting first sampled differential output voltages;
   a first A/D conversion circuit comparing the analog input signal with the reference voltages to perform a higher-order A/D conversion of the input analog signal;
   means for selecting at least two of the first sampled differential output voltages;
   a set of second sample circuits sampling the first sampled differential output voltages selected by the selecting means, and outputting second sampled differential output voltages;
   means for dividing an interval between the second sampled differential output voltages, and for generating divided voltages in accordance with said dividing; and
   a second A/D conversion circuit comparing the divided voltages to perform a lower-order A/D conversion of the analog input signal.

4. A serial-parallel type A/D converter comprising:
   means for generating a plurality of different reference voltages;
   a set of differential conversion circuits having first input terminals subjected in common to an analog input signal and second input terminals subjected to the respective reference voltages, and converting differences between voltages at the first and second input terminals into differential output voltages;

a first A/D conversion circuit comparing the analog input signal with a reference voltage intermediate the reference voltages of adjacent differential conversion circuits to perform a higher-order A/D conversion of the input analog signal;

means for selecting at least two of the differential output voltages;

means for dividing an interval between the differential output voltages selected by the selecting means, and for generating divided voltages in accordance with said dividing; and a second A/D conversion circuit comparing the divided voltages to perform a lower-order A/D conversion of the analog input signal;

wherein a comparison voltage range of the second A/D conversion circuit contains a comparison voltage range of a unit comparison segment of the first A/D conversion circuit.

5. A serial-parallel type A/D converter comprising:

means for generating a plurality of different reference voltages;

a set of differential conversion circuits having first input terminals subjected in common to an analog input signal and second input terminals subjected to the respective reference voltages, and converting differences between voltages at the first and second input terminals into differential output voltages;

a first A/D conversion circuit comparing the analog input signal with a reference voltage intermediate the reference voltage of adjacent differential conversion circuits to perform a higher-order A/D conversion of the input analog signal;

means for selecting adjacent three of the differential output voltages;

means for dividing intervals between the differential output voltages selected by the selecting means, and for generating divided voltages in accordance with said dividing; and a second A/D conversion circuit comparing the divided voltages to perform a lower-order A/D conversion of the analog input signal;

wherein a comparison voltage range of the second A/D conversion circuit contains a comparison voltage range of a unit comparison segment of the first A/D conversion circuit.

6. A serial-parallel type A/D converter comprising:

means for generating a plurality of different reference voltages;

a set of differential conversion circuits having first input terminals subjected in common to an analog input signal and second input terminals subjected to the respective reference voltages, and converting differences between voltages at the first and second input terminals into output currents;

a first A/D conversion circuit comparing the analog input signal with the reference voltages to perform a higher-order A/D conversion of the input analog signal;

first selecting means for selecting at least two of the output currents;

means for converting the output currents selected by the first selecting means into corresponding output voltages;

second selecting means for selecting at least two of the output voltages;

means for dividing an interval between the output voltages, and for generating divided voltages in accordance with said dividing; and a second A/D conversion circuit comparing the divided voltages and the output voltages selected by the second selecting means to perform a lower-order A/D conversion of the analog input signal.

7. A serial-parallel type A/D converter comprising:

means for generating a plurality of different reference voltages;

a set of differential conversion circuits having first input terminals subjected in common to an analog input signal and second input terminals subjected to the respective reference voltages, and converting differences between voltages at the first and second input terminals into output voltages;

a first A/D conversion circuit comparing the analog input signal with the reference voltages to perform a higher-order A/D conversion of the input analog signal;

first selecting means for selecting at least two of the output voltages;

second selecting means for selecting at least two of the output voltages selected by the first selecting means;

means for dividing an interval between the output voltages selected by the first selecting means, and for generating divided voltages in accordance with said dividing; and a second A/D conversion circuit comparing the divided voltages and the output voltages selected by the second selecting means to perform a lower-order A/D conversion of the analog input signal.

8. A serial-parallel type A/D converter comprising:

means for generating a plurality of different reference voltages;

a set of differential circuits deriving differences between a voltage of an analog input signal and the respective reference voltages, and converting said differences into corresponding difference signals;

first A/D converting means for converting the input analog signal into a higher-order part of a digital signal;

means for selecting at least two of the difference signals in response to a result of said converting by the first A/D converting means; and second A/D converting means for deriving a lower-order part of the digital signal from the difference signals selected by the selecting means.

9. A serial-parallel type A/D converter comprising:

means for generating a plurality of different reference voltages;

a set of differential circuits deriving differences between a voltage of an analog input signal and the respective reference voltages, and converting said differences into corresponding difference signals;

means for performing a higher-order A/D conversion of the input analog signal;

means for selecting at least two of the difference signals in response to a result of said higher-order A/D conversion;

means for dividing an interval between the difference signals selected by the selecting means, and for generating divided signals in accordance with said dividing; and means for comparing the divided signals to perform a lower-order A/D conversion of the analog input signal.

* * * * *